United States Patent
Fuke et al.

(10) Patent No.: US 7,710,720 B2
(45) Date of Patent: May 4, 2010

(54) ELECTRONIC DEVICE AND FIRE PROTECTING MECHANISM OF THE ELECTRONIC DEVICE

(75) Inventors: Kazuya Fuke, Kawasaki (JP); Naoya Yamazaki, Kawasaki (JP); Hideki Zenitani, Kawasaki (JP); Hideo Araki, Kawasaki (JP); Takashi Shirakami, Kawasaki (JP); Satoshi Ueda, Kawasaki (JP); Kenji Toshimitsu, Kawasaki (JP); Yoshiaki Tada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 18 days.

(21) Appl. No.: 11/964,398

(22) Filed: Dec. 26, 2007

(65) Prior Publication Data

US 2008/0174953 A1 Jul. 24, 2008

(30) Foreign Application Priority Data

Jan. 23, 2007 (JP) ............................. 2007-012115
Jun. 22, 2007 (JP) ............................. 2007-165317

(51) Int. Cl.
*H05K 7/20* (2006.01)
*H05K 5/00* (2006.01)
*A62C 2/12* (2006.01)

(52) U.S. Cl. .................. 361/690; 361/679.45; 361/692; 169/59; 236/49.2; 312/223.2; 312/236; 454/184; 454/369

(58) Field of Classification Search ............ 361/679.46, 361/679.48, 690, 692, 694–695; 169/56, 169/59; 236/49.1, 49.2, 49.5; 312/223.2, 312/236; 337/300, 325, 327, 362, 401, 410, 337/411, 414; 454/184, 369

See application file for complete search history.

(56) References Cited

U.S. PATENT DOCUMENTS

| | | | | | |
|---|---|---|---|---|---|
| 2,270,073 | A | * | 1/1942 | Merry | 49/7 |
| 3,650,069 | A | * | 3/1972 | Alley | 49/7 |
| 4,646,847 | A | * | 3/1987 | Colvin | 169/49 |
| 6,155,921 | A | * | 12/2000 | Evans et al. | 454/184 |
| 6,283,850 | B1 | * | 9/2001 | Toshimitsu et al. | 454/184 |
| 6,301,108 | B1 | * | 10/2001 | Stockbridge | 361/688 |
| 6,342,004 | B1 | * | 1/2002 | Lattimore et al. | 454/184 |
| 6,404,629 | B1 | * | 6/2002 | Austin et al. | 361/690 |
| 6,626,507 | B2 | * | 9/2003 | Dean | 312/223.2 |
| 6,991,536 | B2 | * | 1/2006 | Perrin | 454/369 |
| 7,173,817 | B2 | * | 2/2007 | Wei | 361/679.48 |
| 2002/0117901 | A1 | * | 8/2002 | Spivey et al. | 307/117 |
| 2005/0068722 | A1 | * | 3/2005 | Wei | 361/686 |

FOREIGN PATENT DOCUMENTS

| | | |
|---|---|---|
| JP | 2001-033089 | 2/2001 |
| JP | 2001-104503 | 4/2001 |

* cited by examiner

*Primary Examiner*—Jayprakash N Gandhi
*Assistant Examiner*—Robert J Hoffberg
(74) *Attorney, Agent, or Firm*—Katten Muchin Rosenman LLP

(57) ABSTRACT

An electronic device having an exhaust opening configured to exhaust air outside, the electronic device includes a door part configured to close the exhaust opening when the electronic device has a predetermined temperature, wherein the door part is rotated based on the own weight of the door part and a wind pressure of the air taken in the electronic device and exhausted outside the electronic device, so that the exhaust opening is closed.

6 Claims, 27 Drawing Sheets

FIG.16
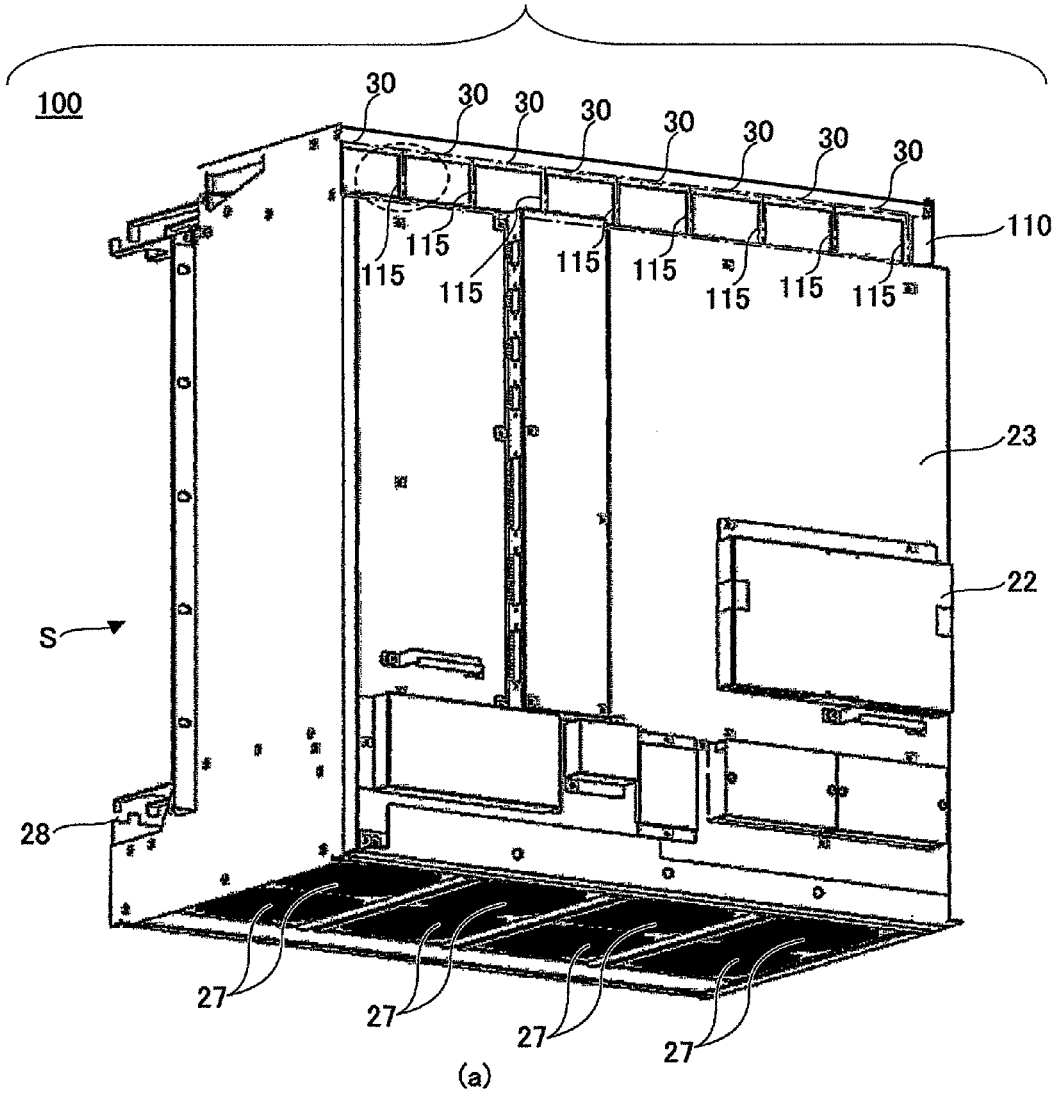
(a)
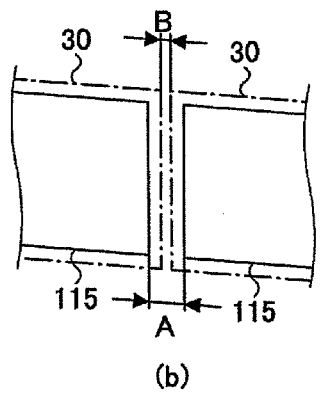
(b)

ELECTRONIC DEVICE AND FIRE PROTECTING MECHANISM OF THE ELECTRONIC DEVICE

BACKGROUND OF THE INVENTION

1. Field of the Invention

The present invention generally relates to electronic devices and fire protecting mechanisms of the electronic devices. More specifically, the present invention relates to an electronic device where plural electronic circuits are provided in a shelf, the electronic device having a self-extinguishing function, and a fire protecting mechanism of the electronic device.

2. Description of the Related Art

Conventionally, in electronic apparatuses such as communication apparatuses, plural PIUs (plug in unit) where electronic components are mounted on a printed wiring board are received in a shelf. By a Plug-In method using connectors of the PIUs, the PIUs are connected to a back board provided in the shelf so that a single electronic device is formed. Plural electronic devices are stacked in a cabinet on plural steps.

FIG. 1 is a perspective view of a related art electronic device. As shown in FIG. 1, a shelf 1 is provided at a front surface (a surface at an X1 side of FIG. 1) in a related art electronic device 10. In the shelf 1, plural PIUs (Plug In Unit, not shown in FIG. 1) where electronic components such as ICs (Integrated Circuit) or LSIs (Large Scale Integrated circuit) are mounted on a printed wiring board are inserted in an X2 direction in FIG. 1.

At a rear surface (a surface at an X2 side of FIG. 1) of the electronic device 10, a sub-back board 2 is provided outside of a back board 3. Connectors for outside interface are provided on the sub-back board 2.

In addition, the temperature inside of the electronic device 10 is increased due to heat radiated by the electronic components. Accordingly, in order to keep the inside the electronic device 10 at a desirable temperature, fans (not shown in FIG. 1) are provided at a lower part of the electronic device 10 as a forced air cooling part.

By using such fans, air is forcibly taken in from the outside of the electronic device 10 in a Z1 direction of FIG. 1 and made to flow inside the electronic device 10, so that the heated electronic components are cooled. Warmed air is exhausted outside the electronic device 10 via an exhaust opening 4 provided at an upper part of a rear surface (a surface at an X2 side of FIG. 1) of the electronic device 10.

In the meantime, such an electronic apparatus is required to have a self-extinguishing function sufficient to prevent spreading of fire to other electronic devices should a fire break out inside the electronic device. Because of this, in the electronic device 10, in order to prevent the spreading of fire outside the electronic device 10, a punched metal screen 5 is provided at the above-mentioned exhaust opening 4. The punched metal screen 5 is made of a metal plate where a large number of openings are formed. By such a punched metal screen 5, even if a fire breaks out inside the electronic device 10, spreading of the fire outside the electronic device 10 is prevented.

In addition, a foaming coating material, if necessary, is applied to the punched metal screen 5 so that when flames or high temperature gas comes in contact with the punched metal screen 5, the foaming coating material foams. If fire breaks out inside the electronic device 10 so that the temperature becomes a certain number of degrees, the coating material foams and thereby the openings formed in the punched metal screen 5 are closed by the coating material. As a result of this, the spreading of fire outside the electronic device 10 is prevented.

An exhaust opening where a configuration of a temperature fuse can be changed has been suggested in order to prevent use of a low temperature fuse in error when a high temperature fuse should be used. See Japanese Laid-Open Patent Application Publication No. 2001-33089.

Furthermore, a mechanism where a butterfly type tamper is closed by a temperature fuse and a closing spring at the time when fire breaks out has been suggested. See Japanese Laid-Open Patent Application Publication No. 2001-104503.

However, in the related art electronic device 10, the punched metal screen 5 is provided at the exhaust opening 4 for exhausting the air flowing inside the electronic device 10 to the outside. Accordingly, the punched metal screen 5 may obstruct the flow of the air exhausting to outside the electronic device 10. Hence, the punched metal screen 5 may degrade the ability to cool the electronic components generating heats.

In addition, the flow of the air exhausting to outside the electronic device 10 is obstructed by the punched metal screen 5. Therefore, if fire breaks out inside the electronic device 10, high temperature air or unburned flammable gas fills the inside of the electronic device 10 so that it is difficult to extinguish the fire. This may cause to obstruction of the self-extinguishing function.

Furthermore, it is difficult to obtain the above-mentioned foaming coating material which is applied to the punched metal screen 5 and the cost of the foaming coating material is high.

SUMMARY OF THE INVENTION

Accordingly, embodiments of the present invention may provide a novel and useful electronic device and fire protecting mechanism of the electronic device solving one or more of the problems discussed above.

More specifically, the embodiments of the present invention may provide an electronic device and fire protecting mechanism of the electronic device whereby cooling abilities of the electronic device can be improved, fire spreading to outside the electronic device can be prevented even if fire breaks out inside the electronic device, and a self-extinguishing function of the electronic device can be improved by exhausting high temperature air or flammable gas to the outside of the electronic device.

One aspect of the present invention may be to provide an electronic device having an exhaust opening configured to exhaust air outside, the electronic device including a door part configured to close the exhaust opening when the electronic device has a predetermined temperature, wherein the door part is rotated based on the own weight of the door part and a wind pressure of the air taken in the electronic device and exhausted outside the electronic device, so that the exhaust opening is closed.

Another aspect of the present invention may be to provide a fire protecting mechanism of an electronic device having an exhaust opening configured to exhaust an air outside, wherein the fire protecting mechanism has a heat sensing member that is operated when a predetermined part inside the electronic device reaches a predetermined temperature, and thereby attachment of a door part to a top plate is broken; and the door part is rotated based on the own weight of the door part and a wind pressure of the air taken into the electronic device and exhausted outside the electronic device, so that the exhaust opening is closed.

Other aspect of the present invention may be to provide an electronic device having an exhaust opening configured to exhaust air outside, the electronic device including a door part configured to close the exhaust opening by rotating; and a line shaped member stretched along the substantially full width of the door part so as to keep the door part from rotating and keep the exhaust opening open; wherein the line shaped member is cut or extended in a length equal to or greater than a designated length so that the door part is rotated by the own weight of the door part and closes the exhaust opening.

Other aspect of the present invention may be to provide a fire protecting mechanism of an electronic device having an exhaust opening configured to exhaust air outside, the electronic device including a plurality of door parts configured to close the exhaust opening by rotating; and a plurality of line shaped members stretched along the substantially full 1 width of respective door parts so as to keep the door parts from rotating and keep the exhaust opening open; wherein the line shaped member is cut or extended in a length equal to or greater than a designated length so that the door part is rotated by the own weight of the door part and closes the exhaust opening; at least one door part among the plural door parts closes the exhaust opening and at least one other door part among the plural door parts maintains the exhaust opening open, when fire breaks out in the electronic device.

According to embodiments of the present invention, it is possible to provide an electronic device and fire protecting mechanism of the electronic device whereby cooling abilities of the electronic device can be improved, fire spreading to outside the electronic device can be prevented even if fire breaks out inside the electronic device, and a self-extinguishing function of the electronic device can be improved by exhausting high temperature air or flammable gas to the outside of the electronic device.

Other objects, features, and advantages of the present invention will become more apparent from the following detailed description when read in conjunction with the accompanying drawings.

BRIEF DESCRIPTION OF THE DRAWINGS

FIG. 16 is a second rear perspective view seen from a bottom side of an electronic device of a modified example of the electronic device shown in FIG. 3;

DETAILED DESCRIPTION OF THE PREFERRED EMBODIMENTS

A description is given below, with reference to the FIG. 2 through FIG. 32 of embodiments of the present invention.

1. First Embodiment of the Present Invention

First, a structure of an electronic device of a first embodiment of the present invention is discussed and then operations of the electronic device are discussed.

[Structure of Electronic Device]

Figure 1:
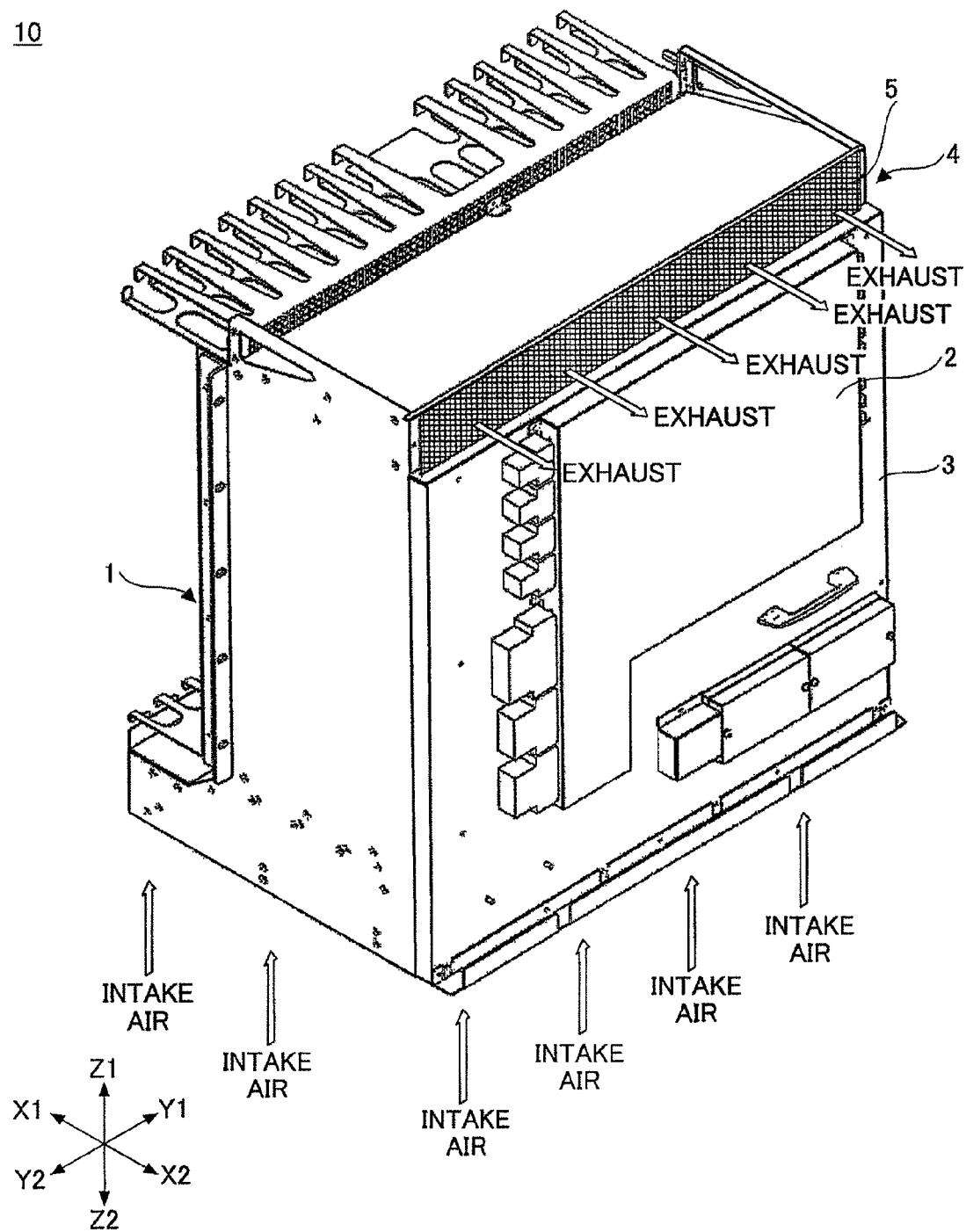
FIG. 1 is a perspective view of a related art electronic device.
Figure 2:
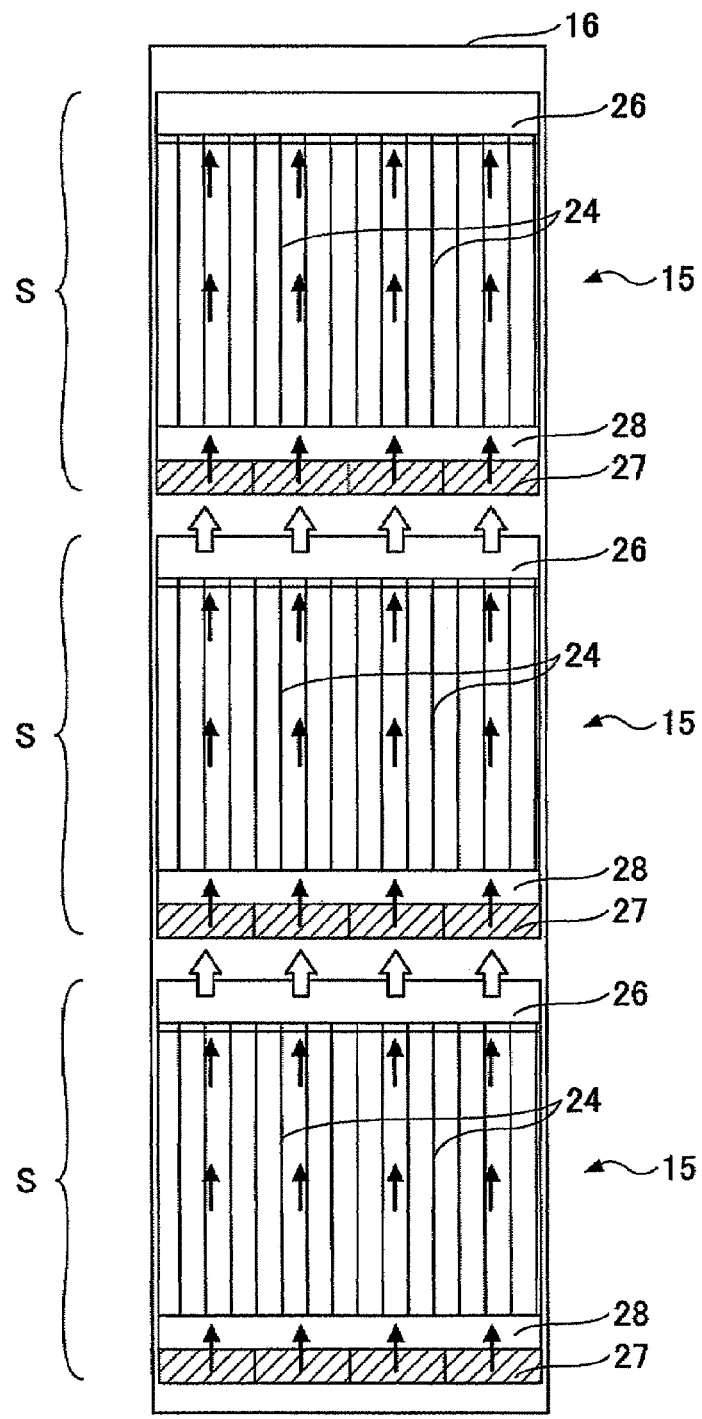
FIG. 2 is a front view of an electronic apparatus where plural steps of electronic devices of a first embodiment of the present invention are provided.
Figure 3:
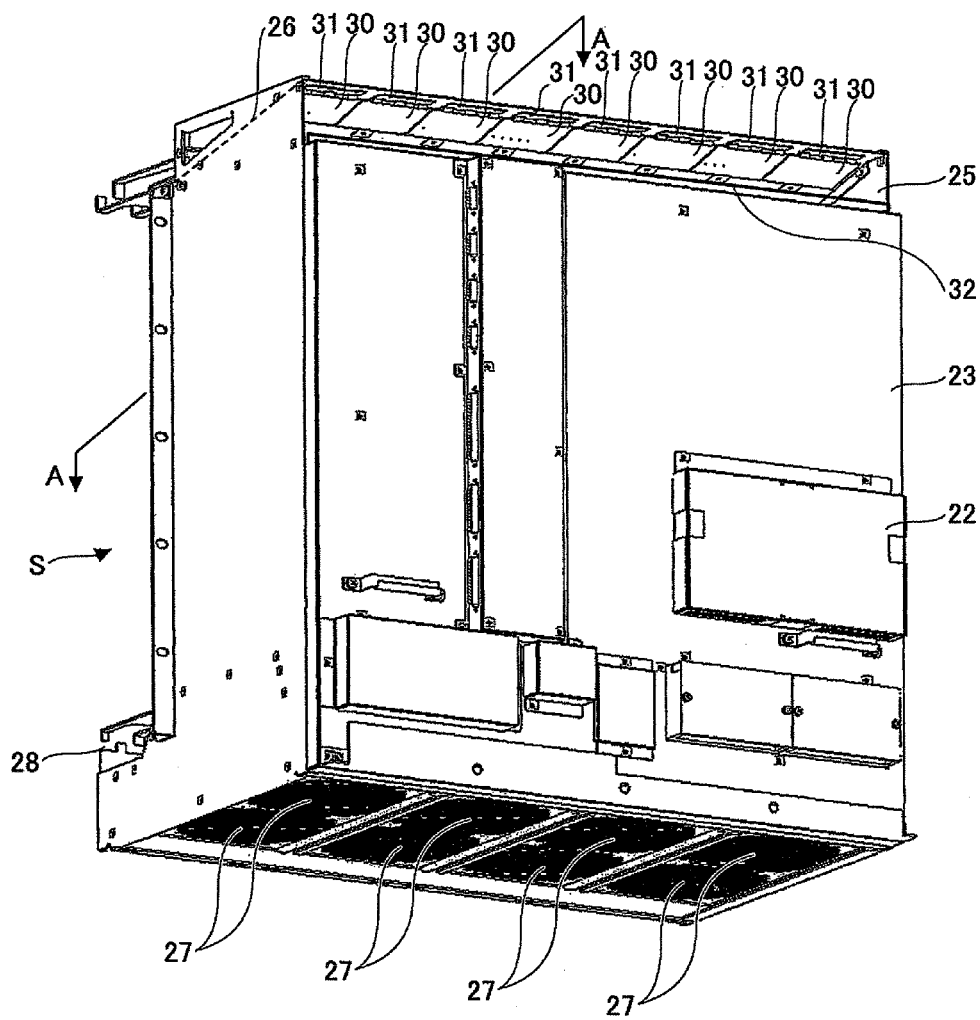
FIG. 3 is a rear perspective view seen from a bottom side of the electronic device of the first embodiment of the present invention.

FIG. 2 is a front view of an electronic apparatus where three steps of electronic devices of a first embodiment of the present invention are provided. FIG. 3 is a rear perspective view seen from a bottom side of the electronic device of the first embodiment of the present invention.

Referring to FIG. 2, in an electronic apparatus 20, plural (three in the example shown in FIG. 2) electronic devices 15 of the first embodiment of the present invention are stacked in three steps in a cabinet 16. Plural PIUs (plug in unit) where electronic components are mounted on a printed wiring board are received in a shelf S. By a Plug-In method using connectors of the PIUs, the PIUs are connected to a back board provided in the shelf S so that a single electronic device 15 is formed. Each electronic device 15 (shelf S) is detachably provided in the cabinet 16 with a predetermined gap.

Referring to FIG. 3, in the shelf S provided at a front surface (a surface at an X1 side of FIG. 3) of the electronic device 15, plural PIUs where electronic components such as ICs (Integrated Circuit) or LSIs (Large Scale Integrated circuit) are mounted on a printed wiring board are inserted in an X2 direction in FIG. 3, in a state where the main surface of the printed wiring board is positioned in a direction perpendicular to the ground.

Metal partition plates 24 (see FIG. 2) are provided in the shelf S so that slots in the shelf S are divided. Because of this structure, even if the electronic components of the PIU or the printed wiring boards are burned due to a fire or the like, it is possible to prevent the fire from moving to the neighboring PIUs.

While these metal partition plates 24 (see FIG. 2) are provided at heights where top ends of the printed wiring boards of the PIUs are positioned, the metal partition plates 24 are not provided in a position where an exhaust opening 25 in an upper part of a rear surface (a surface at an X2 side of FIG. 3) of the electronic device 15 is situated, and thereby the exhaust opening 25 is not divided by the partition plates 24.

Door parts 30 discussed below are rotated so that the exhaust opening 25 is closed. In the example shown in FIG. 3, eight door parts 30 are provided. All of the eight door parts 30 are closed so that the entire exhaust opening 25 is closed.

A top plate 26 is, as shown by a dotted line in FIG. 3, obliquely provided against (provided at an oblique angle with) a horizontal surface (X-Y surface) at the upper end of the electronic device 15. Thus, the rear surface side (the X2 side of FIG. 3) of the upper end of the electronic device 15 is situated higher than the front surface side (the X1 side of FIG. 3). The exhaust opening 25 is open in the upper part of the rear surface side (the X2 side of FIG. 3).

Since the temperature inside the electronic device 15 increases due to heat generated by the electronic components or the like, plural fans 27 are provided at a lower part of the electronic device 15 as forced air cooling parts so that the inside of the electronic device 15 can be kept at a desirable temperature. In other words, an air intake opening is formed at a bottom part of the electronic device 15. For the convenience to see in FIG. 2, positions where the fans 27 are provided are indicated by oblique lines (hatching).

By using the fans 27, air is forcibly taken in from outside the electronic device 15 in a Z1 direction of FIG. 3 and made to circulate from a lower part to an upper part inside the electronic device 15 as indicated by black arrows in FIG. 2, so that the heated electronic components are cooled. The moving direction of the warmed air is curved by an inside surface of the top plate 26 obliquely provided at the upper end of the electronic device 15 and the air is exhausted outside the electronic device 15 via the exhaust opening 25 provided at the upper part of the rear surface (the surface at an X2 side of FIG. 3) of the electronic device 15. Thus, a cooling mechanism by air flow, namely air intake by the fans 27 and air exhaust via the exhaust opening 25, is formed in each electronic device 15. The operations of the fans 27 are not stopped even if fire breaks out in a slot of the shelf S.

As shown by white arrows in FIG. 2, in the electronic apparatus 20 where three electronic devices 15 are stacked in the cabinet 16, the air is taken into the fans 27 of the electronic device 15 provided above the top plate 26 of the electronic device 15 situated directly under it, along the external side surface of the top plate 26. Accordingly, by the top plate 26 being obliquely provided at the upper end of the electronic device 15, the air flowing in the electronic device 15 can be led into the exhaust opening 25 and air can be led into the fans 27 of the electronic device 15 provided directly on (above) it. Accordingly, it is possible to make the electronic device 15 short so that it is possible to correspond to a cabinet having a low height.

As shown in FIG. 2 and FIG. 3, a cable duct 28 is provided under the shelf S at the front surface (the surface at the X1 side of FIG. 3) of the electronic device 15. The cables connected to the printed wiring boards of the PIUs are received in the cable duct 28. In a position in the electronic device 15 corresponding to where the cable duct 28 is positioned, the air taken in by the fans 27 is rectified so as to flow in the shelf S.

At the rear surface (the surface at the X2 side of FIG. 3) of the electronic device 15, a sub-back board 22 is provided outside the back board 23. A connector for outside interface is provided at the sub-back board 22.

Structures of the door parts 30 and the peripheries of the door parts 30 are discussed with reference to FIG. 4 and others. As discussed above, while eight door parts 30 are provided in this example, each door 30 has the same structure. Therefore, in the following explanation, structures of a single door part 30 and the periphery of the door part 30 are discussed and explanation of structures of the other seven door parts 30 and the peripheries thereof is omitted.

Figure 4:
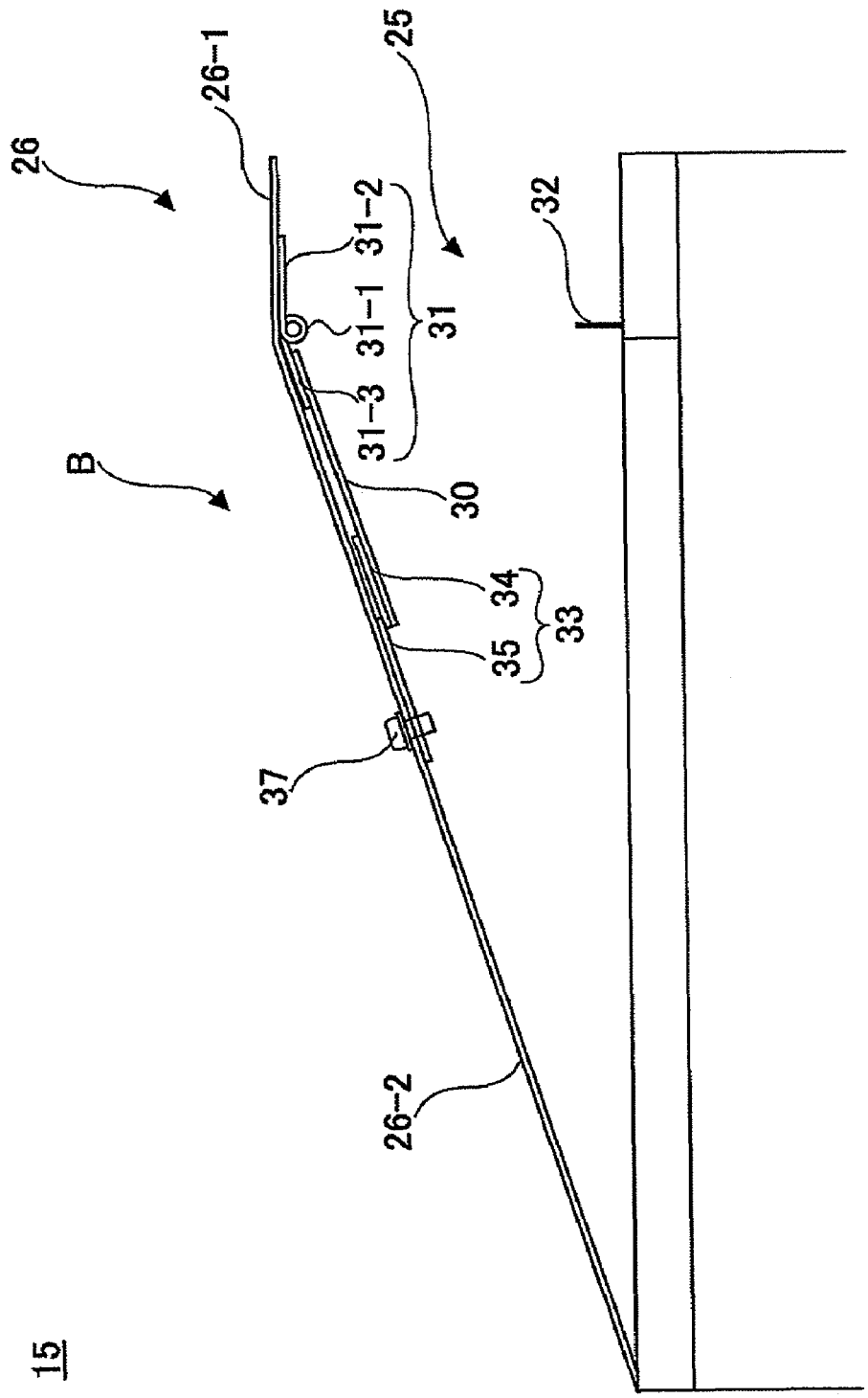
FIG. 4 is a cut-away side view taken along a line A-A of FIG. 3 of an upper part of the electronic device.

FIG. 4 is a cut-open side view taken along a line A-A of FIG. 3 of an upper part of the electronic device 15. The front surface side (the surface at the X1 side of FIG. 3) of the electronic device 15 corresponds to the left side in FIG. 4 and the rear surface side (the surface at the X2 side of FIG. 3) of the electronic device 15 corresponds to the right side in FIG. 4.

As shown in FIG. 4, the top plate 26 is provided obliquely bent against the horizontal surface at the upper end of the electronic device 15. The exhaust opening 25 is at the top part of the rear surface of the electronic device 15. In a part from the exhaust opening 25 to the front surface of the electronic device 15, the top plate 26 is formed to be substantially parallel with a horizontal surface. In the following explanation, a part provided obliquely against the horizontal surface of the top plate 26 is called an inclination part 26-2 and a part provided to be substantially parallel with a horizontal surface of the top plate 26 is called a horizontal part 26-1.

An axial fitting 31 such as a hinge is provided on the horizontal part 26-1 of the top plate 26 as a door rotational member. The axial fitting 31 includes a single rotational axle 31-1 and two metal plates 31-2 and 31-3 rotatably connected to the rotational axle 31-1. The metal plate 31-2 is fixed to the horizontal part 26-1 of the top plate 26 by a screw or the like. The metal plate 31-3 is fixed to the door part 30 by a screw or the like. The rotational axle 31-1 of the axial fitting 31 is positioned in the vicinity of the bend where the inclination part 26-2 and the horizontal part 26-1 of the top plate 26 are connected to each other.

Accordingly, the door part 30 fixed to the metal plate 31-3 can be rotated with respect to the rotational axle 31-1 of the axial fitting 31.

A stopper 32 as a door rotation stopping member is provided at a bottom part of the exhaust opening 25 so that the rotation of the door part 30 is stopped in a position oriented perpendicular to the horizontal surface. As shown in FIG. 3, the stopper 32 has a configuration of a rectangle without a bottom side. That is, two parts having designated lengths are formed in a vertical direction (Z1-Z2 direction) in the vicinities of the side surfaces (the surfaces at the Y1 and Y2 sides of FIG. 3) of the electronic device 15 and are bent in the width direction of the electronic device 15 (in the Y1-Y2 direction). The door part 30 may have a size of approximately 65 mm×55 mm.

Figure 5:
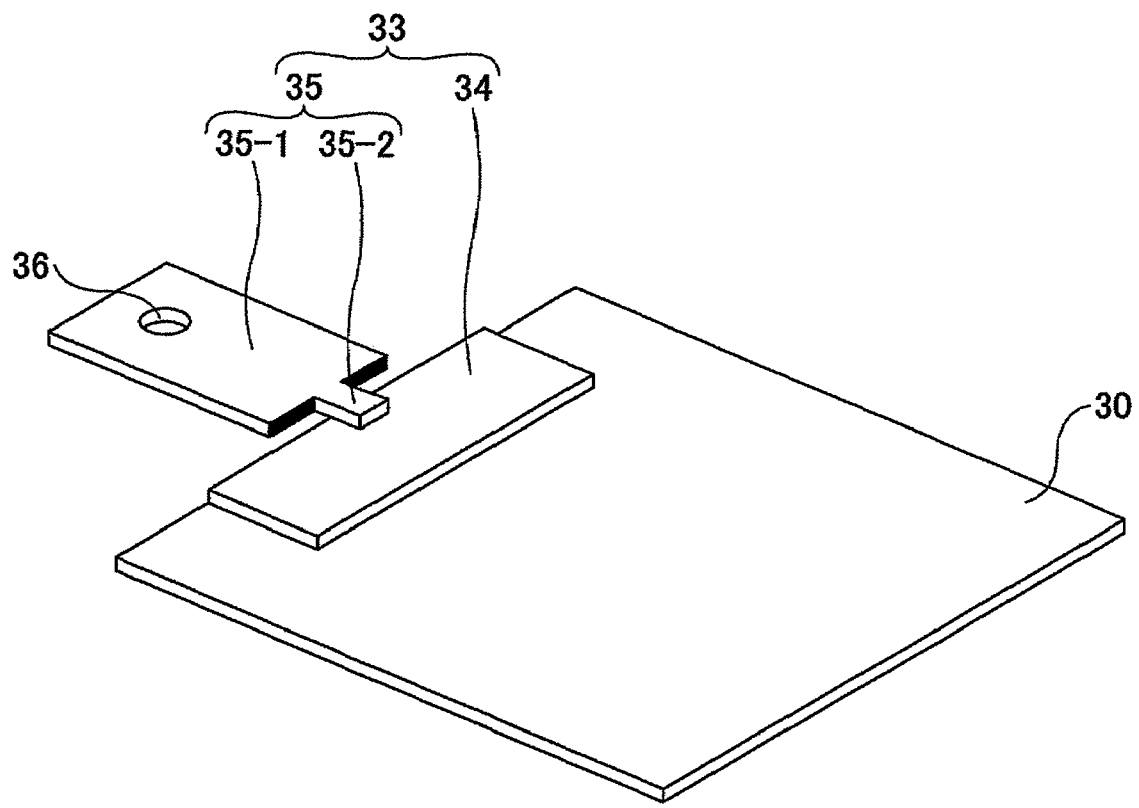
FIG. 5 is a perspective view of a door part and a structure in the vicinity of the door part.

FIG. 5 is a perspective view of the door part 30 and a structure in the vicinity of the door part 30. More specifically, FIG. 5 is a view of the door part 30 and the vicinity of the door part 30 seen in a direction indicated by the arrow B in a state where the top plate 26 and the axial fitting 31 shown in FIG. 4 are removed. The metal plate 31-3 of the axial fitting 31 shown in FIG. 4 is connected to a part of the upper surface of the door part 30 shown in FIG. 5.

A temperature fuse 33 is provided at a part separated from where the metal plate 31-3 of the axial fitting 31 shown in FIG. 4 is situated on an upper surface of the door part 30.

The temperature fuse 33 is formed by connecting the first metal plate 34 and the second metal plate 35 to each other by a hot-melt member discussed below.

The first metal plate 34 is provided at a part separated from where the metal plate 31-3 of the axial fitting 31 shown in FIG. 4 is situated on an upper surface of the door part 30 by welding or a fixing member such as a screw.

The second metal plate 35 has a convex-shaped plan view configuration and includes a main body part 35-1 and a convex-shaped head end part 35-2 extending from the main body part 35-1. A piercing hole 36 is formed in the main body part 35-1 of the second metal plate 35. As shown in FIG. 4, the screw 37 is engaged with the piercing hole 36 of the second metal plate 35 and a piercing hole (not shown in FIG. 4) formed in the inclination part 26-2 of the top plate 26 so that the second metal plate 35 and the inclination part 26-2 of the top plate 26 are connected to each other.

As discussed above, the first metal plate 34 and the second metal plate 35 are adhered to each other by the hot-melt member. Such an adhesion structure is discussed below.

In this example, paste solder is used as the hot-melt member. For example, lead (Pb) free solder may be used in terms of impact on the environment. Printing is performed on an adhering part described below by using a metal mask and applying a melting-connection process in an oven so that the solder hot-melt member is provided. By this method, it is possible to control the amount of adhesion of the solder. Generally, it is difficult to solder on a metal plate because heat is rapidly transferred. However, by soldering with the above-mentioned reflow process, it is possible to easily cause the solder to adhere.

The hot melt member configured to adhere to the first metal plate 34 and the second metal plate 35 is not limited to solder. For example, a thermoplastic adhesive may be used as the hot melt member.

The hot melt member is provided at the head end of a lower surface of the convex-shaped head end part 35-2 of the second metal plate 35 having a convex-shaped plan view configuration.

A forming area of the hot melt member in the concave-shaped head end part 35-2 has the strength necessary for the concave-shaped head end part 35-2 to maintain impact resistance. For example, the forming width of the hot melt member may be approximately 3 mm and the forming area of the hot melt member is approximately 5 through 25 mm².

A part of the head end side of the lower surface of the convex-shaped head end part 35-2 of the second metal plate 35 and the first metal plate 34 are adhered to each other via such a hot melt member.

When fire breaks out in a slot of a shelf S (see FIG. 3) so that temperature increases to be approximately 220° C., which is a melting point of solder, or greater, the hot melt member made of solder is melted and thereby the adhesion of the first metal plate 34 and the second metal plate 35 is broken (no longer exists). As a result of this, the door part 30 provided on the first metal plate 34 can be rotated by gravity with respect to the rotational axle 31-1 of the axial fitting 31 as shown by an arrow in FIG. 6.

In particular, in this example as discussed above, the hot melt member is provided at not the entire lower surface of the concave-shaped head end part 35-2 of the second metal plate 35 having a concave-shaped plan view configuration but only at a part of the head end part 35-2. Accordingly, in a state where a designated gap is formed between the end surface shown in black color in FIG. 5 of the concave-shaped head end part 35-2 of the main body part 35-1 of the second metal plate 35 and the side edge part of the first metal plate 34, the first metal plate 34 and a part of the head end of the lower surface of the concave-shaped head end part 35-2 of the second metal plate 35 are adhered to each other via the hot melt member.

As discussed above, when the temperature becomes approximately 220° C., which is a melting point of solder, or greater, the hot melt member made of the solder is melted, that is, the temperature fuse 33 operated due to the heat generated. However, such operations temperature depends on the adhesion area of the solder that is the hot melt member. If a gap is not formed between the end surface shown in black color in FIG. 5 of the concave-shaped head end part 35-2 of the main body part 35-1 of the second metal plate 35 and the side edge part of the first metal plate 34, and the hot melt member is formed on the entire lower surface of the concave-shaped head end part 35-2 of the second metal plate 35 so that the first metal plate 34 and a part of the head end of the lower surface of the concave-shaped head end part 35-2 of the second metal plate 35 are adhered to each other, the hot melt member made of solder is adhered to the end surface shown in black color in FIG. 5 of the concave-shaped head end part 35-2 of the main body part 35-1 of the second metal plate 35. As a result of this, the adhesion area of the solder may be different from a designated area so that the operations temperature of the temperature fuse 33 may be affected.

On the other hand, a part of the head end of the lower surface of the convex-shaped head end part 35-2 of the second metal plate 35 is adhered to the first metal plate 34 by the hot melt member where a predetermined gap is formed between the end surface (indicated in black color in FIG. 5) at the convex-shaped head end 35-2 of the main body part 35-1 of the second metal plate 35 and the side edge part of the first metal plate 34. As a result of this, it is possible to precisely manage the adhering area of the solder to have a predetermined value. Therefore, it is possible to stabilize the operations temperature of the temperature fuse 33.

Here, the weight of the door part 30 configured to be rotated is discussed with reference to FIG. 2 and FIG. 7.

As indicated by black arrows in FIG. 2, the air taken in from outside by the fans 27 flows from the lower part to the upper part inside the electronic device 15. As indicated by white arrows in FIG. 7, the direction of the flow of the air is curved by the inside surface of the top plate 26 and is exhausted outside the electronic device 15 via the exhaust opening 25 provided at the upper part of the rear surface of the electronic device 15.

Accordingly, it is necessary for the door part 30 to have its own weight sufficient so that the door part 30 can be rotated regardless of the wind pressure of the air flowing from the lower part to the upper part inside the electronic device 15 when the temperature reaches the operations temperature of the temperature fuse 33.

Figure 7:
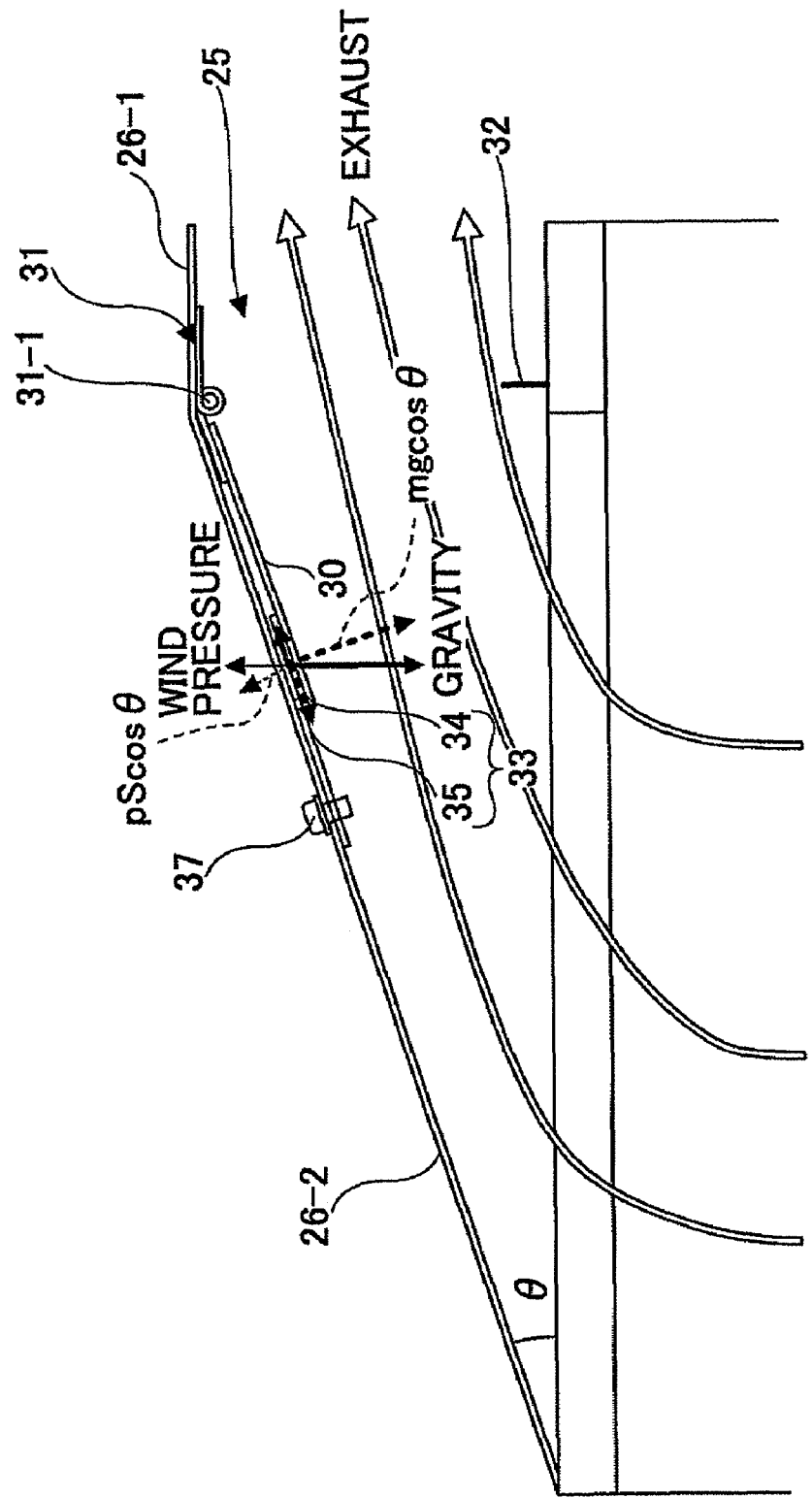
FIG. 7 is a view for explaining the weight of the door part.

More specifically, as shown in FIG. 7, it is necessary to satisfy the following formula.

$$m \times g \times \cos\theta > p \times S \times \cos\theta, \text{namely}$$

$$m \times g > p \times S$$

wherein "m" represents the own weight of the door part 30; "g" represents acceleration of gravity; "p" represents a wind pressure of the air taken in from the outside by the fans 27; "S" represents the area of the door part 30; and "θ" represents an inclination angle of the inclination part 26-2 of the top plate 26 against the horizontal surface.

In other words, it is necessary for the door part 30 to have its own weight greater than a value calculated by the following formula: "the wind pressure p of the air the air taken into the electronic device 25 and exhausted outside the electronic device 25"×"the area S of the door part 30 where the wind pressure p acts"÷"acceleration of gravity g"

As a result of this, when the temperature reaches the operations temperature of the temperature fuse 33, the door 30 can start being rotated regardless of the wind pressure of the air flowing from the lower part to the upper part inside the electronic device 15.

[Operations of the Electronic Device 15]

Next, the operations of the electronic device 15 having the above-discussed structure are discussed.

First, a normal state where fire does not break out inside the electronic device 15 is discussed, and then a case where the fire breaks out inside the electronic device 15 is discussed.

[Normal State]

Referring back to FIG. 2 and FIG. 7, in a normal state where the fire does not break out inside the electronic device 15, cooling by the air flow, namely air intake by the fans 27 and the exhaust of the air via the exhaust opening 25, is sustained. In other words, as indicated by the black arrows in FIG. 2, the air taken in from the outside by the fans 27 for cooling the electronic components such as the PIUs provided in the slots of the shelves S flows from the lower part to the upper part inside the electronic device 15. As indicated by the white arrows in FIG. 7, the direction of the air flow is curved by the inside surface of the top plate 26 so that the air is exhausted to the outside via the exhaust opening 25 provided at the upper part of the rear surface of the electronic device 15.

In this state, the door part 30 is fixed to the top plate 26 via the temperature fuse 33 and the hinge 31. As discussed above, the temperature fuse 33 is formed by adhering the first metal plate 34 and the second metal plate 35 via the hot melt member. The first metal plate 34 is connected to the door part 30 and the second metal plate 35 is connected to the inclination part 26 of the top plate 26. Accordingly, the hot melt member adhering to the first metal plate 34 and the second metal plate 35 is pulled by the gravitational forces of the door part 30 and the first metal plate 34.

In addition, as discussed above, the direction of the flow of the air flowing from the lower part to the upper part inside the electronic device 15 is curved by the inside surface of the top plate 26 obliquely provided against a horizontal surface. The air is exhausted to the outside via the exhaust opening 25 provided at the upper part of the rear surface of the electronic device 15. Accordingly, a pressure (wind pressure) acts on the door part 30 fixed to the top plate 26 via the hinge 31 and the temperature fuse 33 to apply force upward, namely in a direction opposite to the direction of the gravitational forces of the door part 30 and the first metal plate 34.

Thus, the gravitational forces of the door part 30 and the first metal plate 34 and the wind pressure act in directions opposite to each other. Accordingly, a pulling force acting on the hot metal member is "the gravitational forces minus the force exerted by the wind pressure" and therefore is less than the force when only the own weights of the door part 30 and the first metal plate 34 act. Accordingly, it is possible to select a material having low pulling strength as the hot melt member configured to adhere the first metal plate 34 and the second metal plate 35 to each other.

[A Case Fire Breaks Out Inside the Electronic Device 15]

If fire breaks out in a certain slot of a shelf S of an electronic device 15, the door part 30 positioned right above the slot is rotated by using the own weights of the door part 30 and the first metal plate 34 and the wind pressure of the air taken in from outside by the fans 27.

In other words, if the fire breaks out in a certain slot so that the temperature in the slot increases and become approximately 220° C., which is a melting point of the solder, or greater, the hot melt member made of solder and configured to adhere the first metal plate 34 provided on the door part 30 positioned right above the slot and the second metal plate 35 is melted so that adherence of the first metal plate 34 and the second metal plate is broken.

Figure 6:
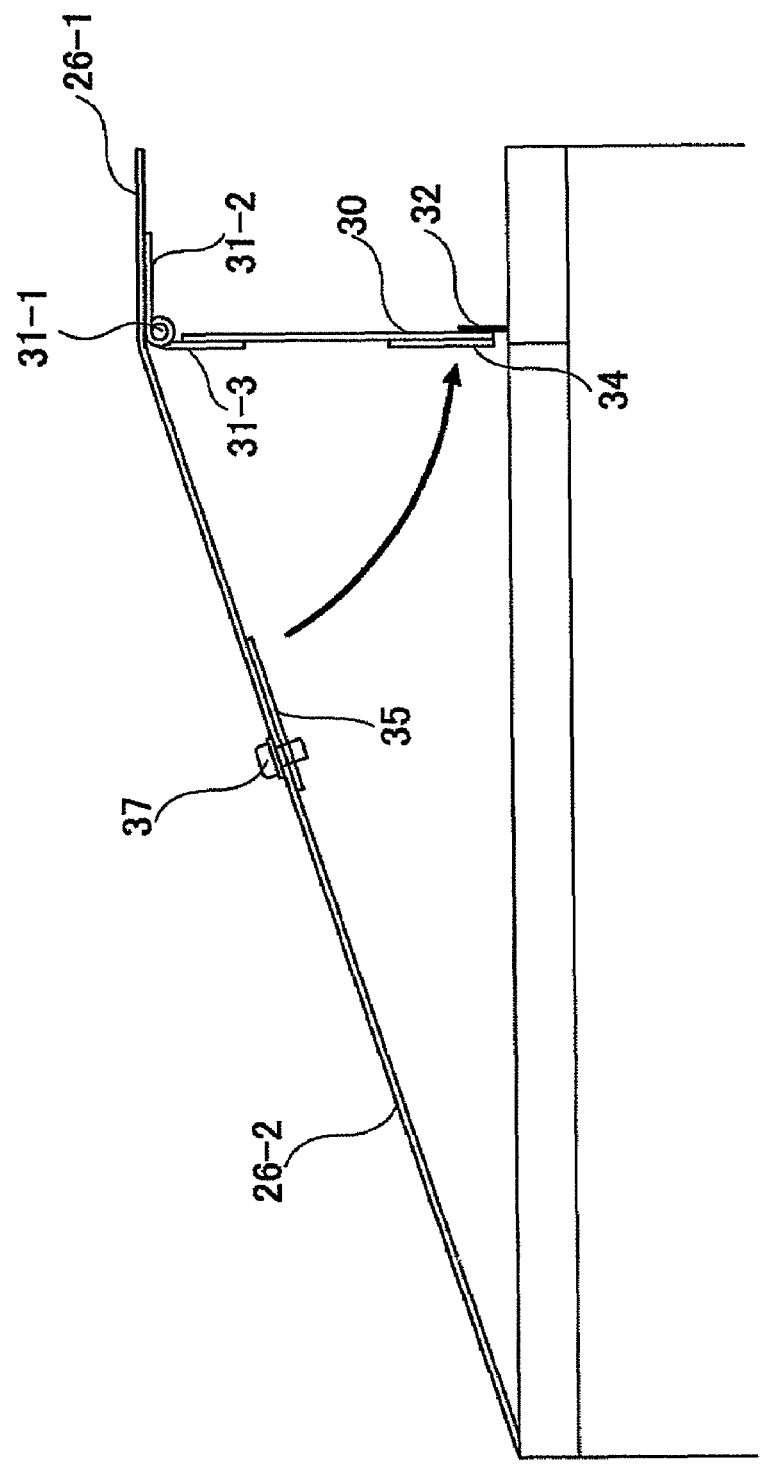
FIG. 6 is a first view showing rotation of the door part shown in FIG. 5.

As a result of this, the door part 30 where the first metal plate 34 is provided is started being rotated with respect to the rotational axle 31-1 of the axial fitting 31 as indicated by the arrow in FIG. 6 by "the gravitational forces of the door part 30 and the first metal plate 34 minus the force of the wind pressure", regardless of the wind pressure of the air flowing from the lower part to the upper part inside the electronic device 15.

Figure 8:
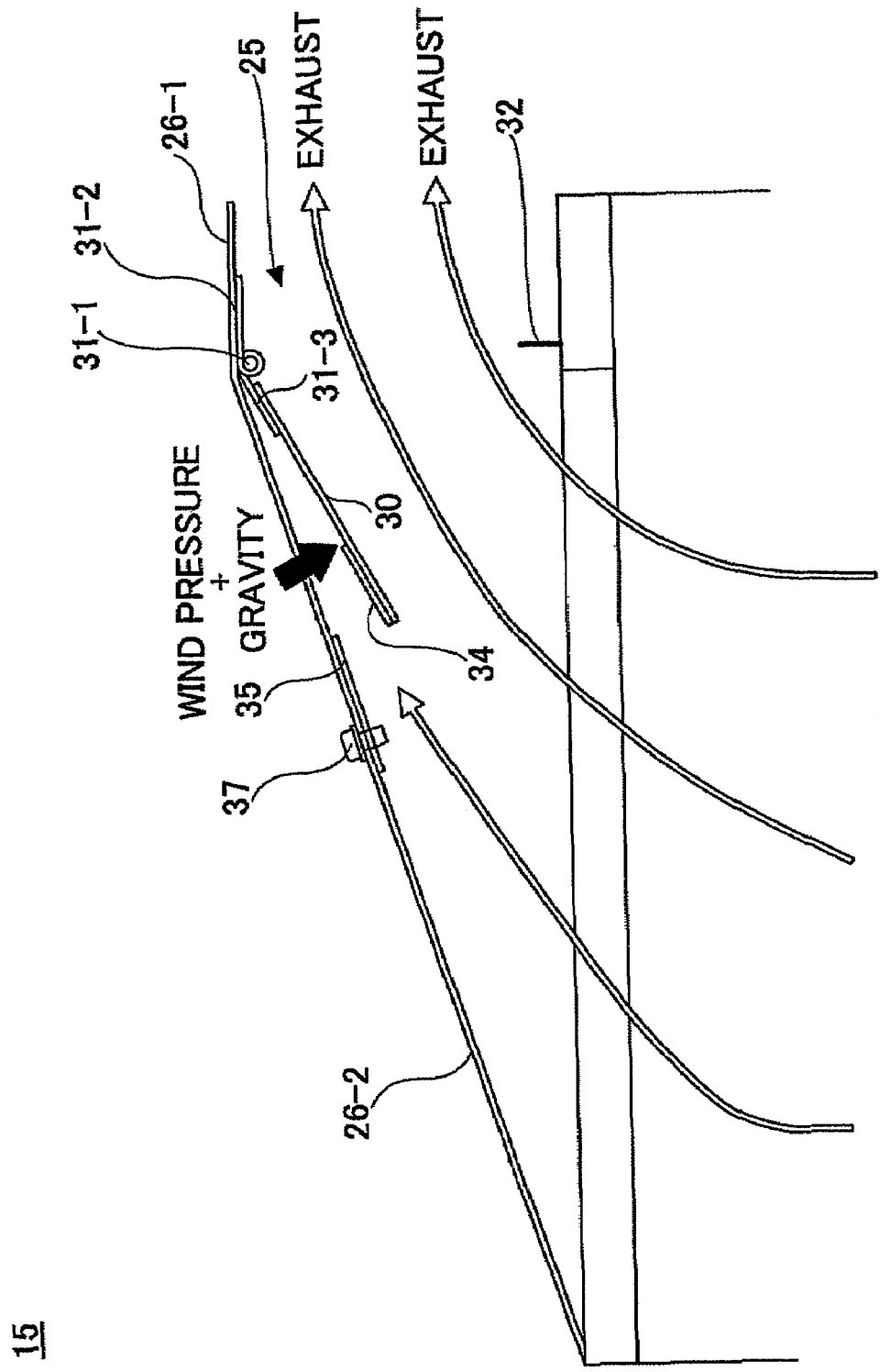
FIG. 8 is a second view showing rotation of the door part shown in FIG. 5.

In FIG. 8, the door part 30 is shown starting to rotate.

As shown in FIG. 8, in a position where the exhaust opening 25 of the electronic device 15 is situated, the flow direction of the air flowing from the lower part to the upper part inside the electronic device 15 is curved by the inside surface of the top plate 26 obliquely provided against a horizontal surface so that the air flows from the front surface side of the electronic device 15 to the rear surface side in an obliquely upper direction.

Accordingly, when the door part 30 is started being rotated, an acting direction of the wind pressure on the door part 30, namely a direction opposite to the gravitational forces of the door part 30 and the first metal plate 34, is changed so that the wind pressure acts in a direction so that the door part 30 is further rotated.

Accordingly, the door part 30 is rotated by using such a wind pressure so that the exhaust opening 25 can be closed by the door part 30 in a short period of time. Hence, even if the fire breaks out inside the electronic device 15, it is possible to prevent the fire from being spreading to the outside in a moment.

Figure 9:
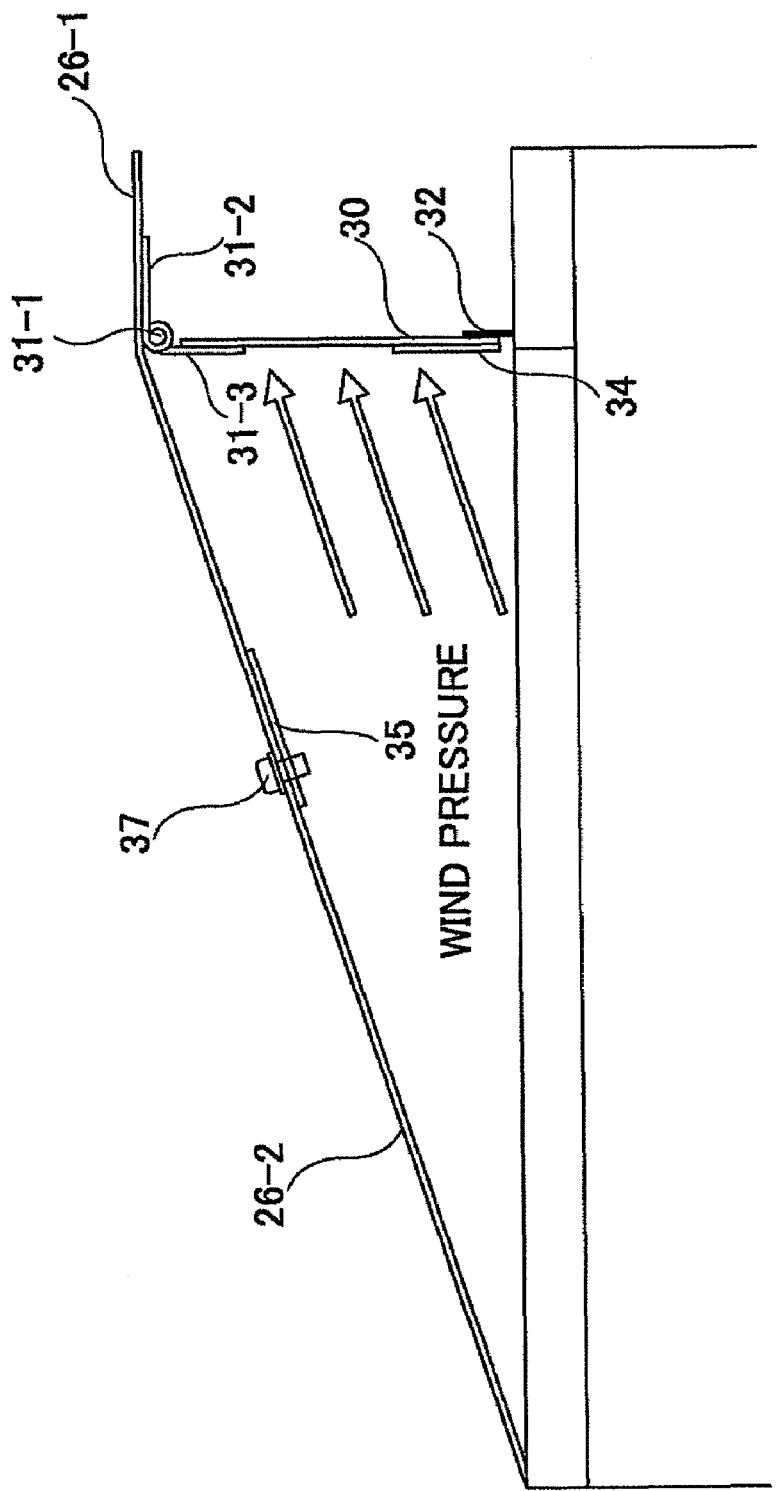
FIG. 9 is a third view showing rotation of the door part shown in FIG. 5.

When the door part 30 is rotated so as to be situated in a plane essentially perpendicular to the horizontal surface, the door part 30 comes in contact with the stopper 32 provided at the lower part of the exhaust opening 25 as shown in FIG. 9.

As shown in FIG. 9, while the wind pressure is acting on the door part 30 in a direction so that the door 30 is pushed to the rear surface side of the electronic device 15, the direction indicated by arrows in FIG. 9, the rotation of the door part 30 is stopped by the stopper 32 in a position oriented essentially perpendicular to the horizontal surface. Accordingly, it is possible to prevent the door part 30 from being further rotated to the rear surface side of the electronic device 15 from the position essentially perpendicular to the horizontal surface. Hence, once the door part 30 closes the exhaust opening, it is possible to maintain the door part 30 closed without having an unstable situation.

In the meantime, the inventors of the present invention performed a simulation based on standard GR-63-CORE where a gas burner is inserted in a lower part of a slot of a shelf S of an electronic device 15 of the first embodiment of the present invention and methane gas is burned, so that the results shown in FIG. 10 through FIG. 20 are achieved.

Figure 10:
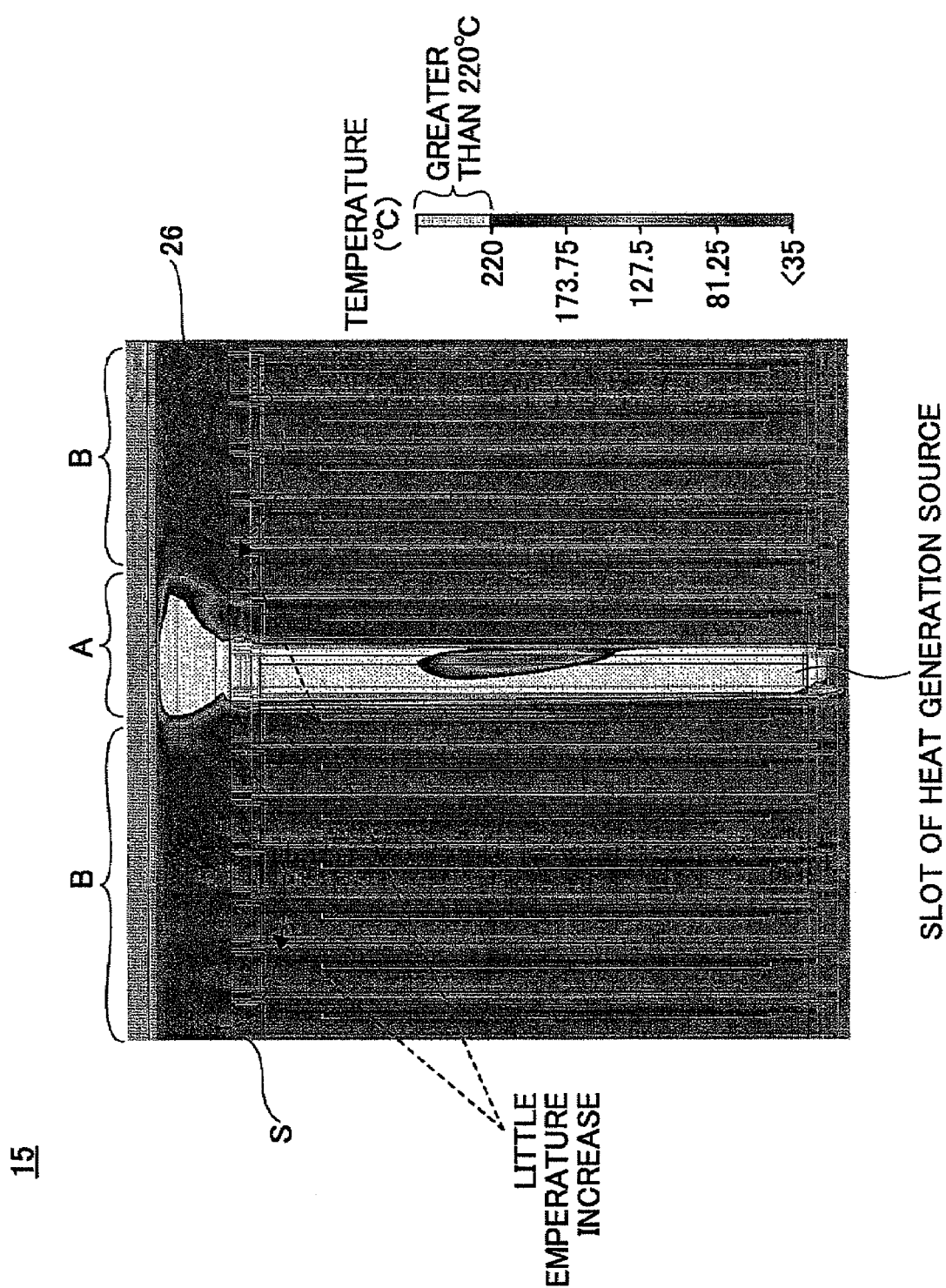
FIG. 10 is a first front view of the electronic device of the first embodiment of the present invention, showing results of simulation of a fire protecting test of the electronic device of the first embodiment of the present invention.
Figure 11:
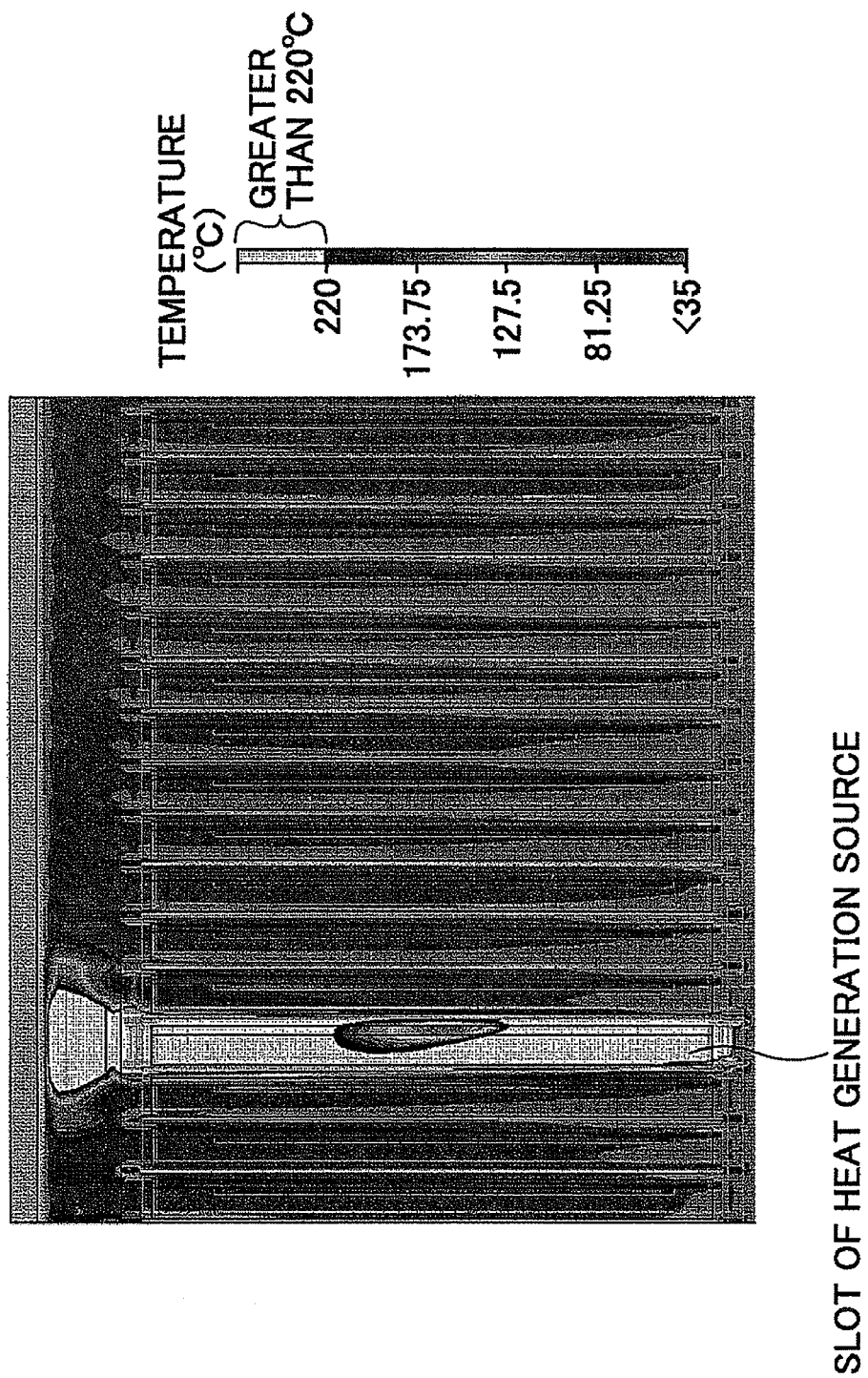
FIG. 11 is a second front view of the electronic device of the first embodiment of the present invention, showing the results of the simulation of the fire protecting test of the electronic device of the first embodiment of the present invention.
Figure 12:
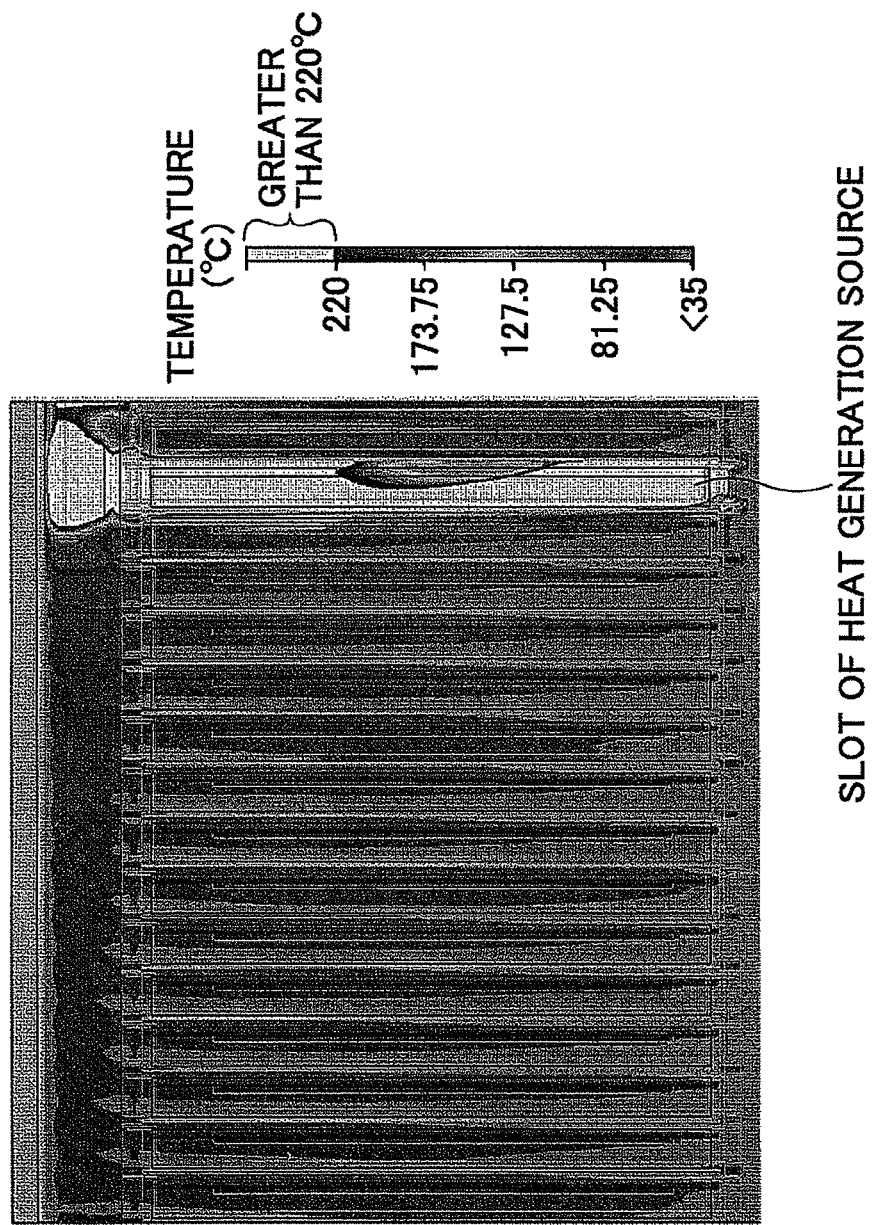
FIG. 12 is a third front view of the electronic device of the first embodiment of the present invention, showing the results of the simulation of the fire protecting test of the electronic device of the first embodiment of the present invention.

Here, FIG. 10 through FIG. 12 are first through third front views of the electronic device 15 of the first embodiment of the present invention, showing results of simulation of a fire protecting test of the electronic device 15 of the first embodiment of the present invention. In FIG. 10 through FIG. 12, temperature distributions in the shelf S are shown.

In the example shown in FIG. 10, the width of the door part 30 situated at the upper part of each slot is set to be approximately 65 mm. In other words, there is a gap of approximately 65 mm between the hot melt members provided for the door parts 30. In the simulation, the gas burner is inserted in the lower part of the slot in the substantially center part of the shelf S and methane gas is burned so that heat of approximately 9 kW is generated.

The hot melt member provided at the temperature fuse 33 positioned at the upper part of the slot where the gas burner is inserted is melted so that the door part 30 where the temperature fuse 33 is provided partially closes the exhaust opening 25. Accordingly, it is possible to prevent the fire from being spreading outside the electronic device and to avoid fire outside the electronic device 15.

In addition, while the temperature in the shelf S increases due to burning of the methane gas, the metal partition plate 24 (see FIG. 2) is provided with a length so that the upper end of the printed wiring board of the PIU is inserted in the slot of the shelf S. Therefore, it is possible to avoid the spreading of the fire to a PIU inserted in a slot neighboring the slot where the gas burner is inserted.

On the other hand, the partition plate 24 (see FIG. 2) is not provided in a part where the exhaust opening 25 is positioned. In this part, a partition with the neighboring slot is not formed. Hence, in this part, high temperature heat, smoke, and flammable gas are spreading in a horizontal direction so as to be exhausted outside the electronic device 15 via the opening part of the exhaust opening 25.

According to the simulation results, a range approximately 80 mm right and left from the center of the slot being a heat generation source has a temperature equal to or greater than the melting point (approximately 220° C. of the solder forming the hot melt member. Accordingly, it is possible to melt the hot melt member positioned closest to the heat source among the hot melt members provided with the gaps of approximately 65 mm.

In addition, there is almost no temperature increase in parts surrounded by dotted lines in FIG. 10. This is because the high temperature heat and smoke are spreading in the horizontal direction in a position where the exhaust opening 25 is provided and exhausted outside the electronic device 15 via the opening part of the exhaust opening 25.

In the example shown in FIG. 10, it is assumed that the gas burner is inserted in the lower part of the slot situated in the substantially center part of the shelf S so that the methane gas is burned and heat of approximately 9 kW is generated. On the other hand, simulation results in cases where a slot being a heat generation source is changed are shown in FIG. 11 and FIG. 12.

In the example shown in FIG. 11, a slot being a heat generation source is situated at the left side. In the example shown in FIG. 12, a slot being a heat generation source is situated at the right side.

In the examples shown in FIG. 11 and FIG. 12 as well as the example shown in FIG. 10, the hot melt member provided at the temperature fuse 33 positioned at the upper part of the slot where the gas burner is inserted is melted so that the door part 30 where the temperature fuse 33 is provided partially closes the exhaust opening 25. Accordingly, it is possible to prevent the fire from being spreading outside the electronic device 15. In addition, high temperature heat, smoke, and flammable gas are exhausted outside the electronic device 15 via the opening part of the exhaust opening 25.

In the meantime, as discussed above, eight door parts 30 are provided in the example shown in FIG. 3. Closing operations of a door part 30 neighboring the door part 30 which closes in the exhaust opening 25 are discussed with reference to FIG. 13 and FIG. 14.

Figure 13:
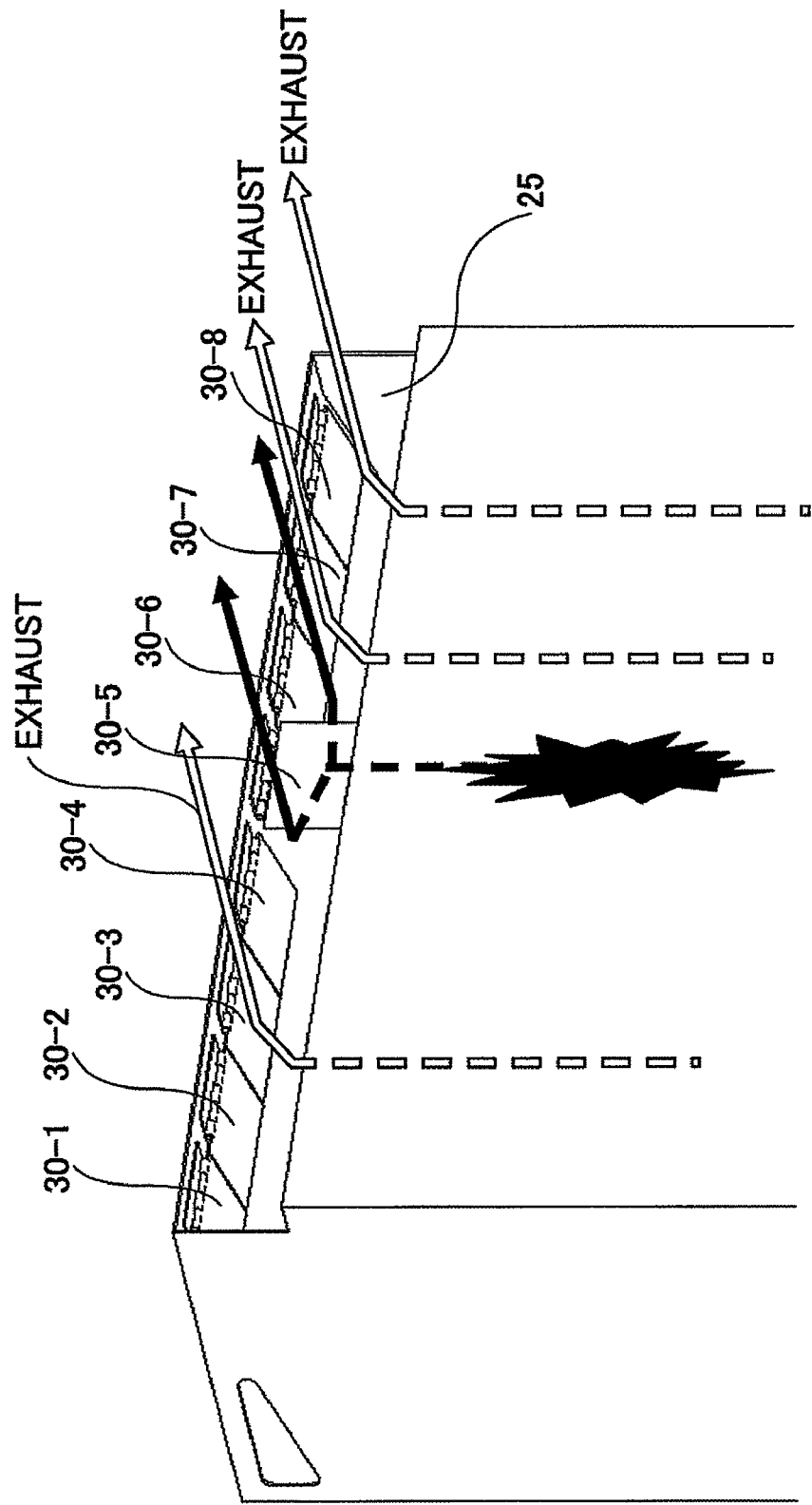
FIG. 13 is a first view for explaining closing operations of a door part neighboring another door part closing an exhaust opening.
Figure 14:
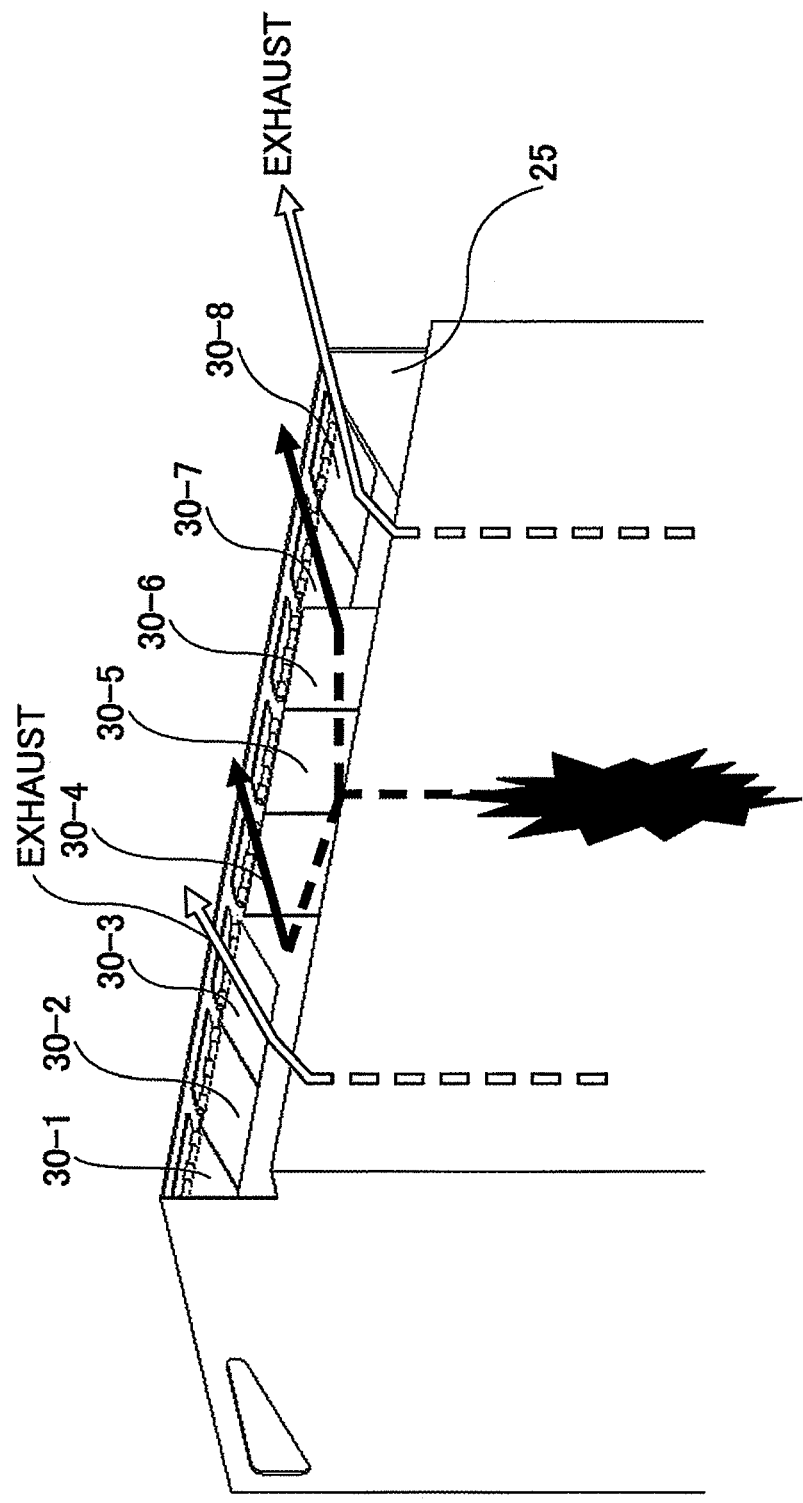
FIG. 14 is a second view for explaining closing operations of a door part neighboring another door part closing an exhaust opening.

FIG. 13 and FIG. 14 are views for explaining closing operations of a door part 30 neighboring another door part 30 closing in an exhaust opening. More specifically, FIG. 13 and FIG. 14 are partially expanded perspective views of rear surface parts of the electronic device 15 shown in FIG. 3 seen from a bottom part. In FIG. 13 and FIG. 14, for the convenience of explanation, the door parts 30 shown in FIG. 3 are drawn as door parts 30-1 through 30-8.

Referring to FIG. 13, if fire breaks out in the slot situated under the door part 30-5 and the temperature increases so as to reach the melting point of the hot melt member provided at the temperature fuse 33 provided at the door part 30-5, the door part 30-5 partially closes the exhaust opening 25.

As a result of this, as indicated by black arrows in FIG. 13, the progression of fire and the flow of high temperature air, smoke, and flammable gas are obstructed by the door part 30-5 so that the fire, high temperature air, smoke, and flammable gas go around the door part 30-5 and attempt to go outside the electronic device 15 via the opening part of the exhaust opening 25. At this time, the temperature fuses 33 provided at the door parts 30-4 and 30-6 neighboring the door part 30-5 operate when the temperatures reach the operations temperatures. Accordingly, the door parts 30-4 and 30-6 partially close the exhaust opening 25 as shown in FIG. 14.

Even if the progression of the fire and the flow of the high temperature air, smoke, and flammable gas are obstructed by the door parts 30-4 through 30-6 so that the fire, high temperature air, smoke, and flammable gas go around the door parts 30-4 through 30-6 and attempt to go outside the electronic device 15 via the opening part of the exhaust opening 25, the temperature fuses 33 provided at the door parts 30-3 neighboring the door part 30-4 and the door parts 30-7 neighboring the door part 30-6 operate when the corresponding temperatures reach the operations temperatures. Accordingly, the door parts 30-3 and 30-7 partially close the exhaust opening 25.

Thus, in this example, the door parts 30-1 through 30-8 close in the exhaust opening 25 in order. Accordingly, it is possible to securely prevent the fire from being outside the electronic device 15 so that the spreading of the fire outside the electronic device 15 can be avoided. In addition, it is possible to exhaust the high temperature air heat, smoke, and flammable gas outside the electronic device 15 via the opening part of the exhaust opening 25.

As long as the temperature fuse 33 provided at the door part 30 situated right above a slot operates if fire breaks out in that slot so that the exhaust opening 26 right above the fire point is closed by the door part 30 and the neighboring other door parts 30 are closed in order depending on the situation, there is no limitation to the number of the door parts 30 for closing the exhaust opening 25 nor the position of the temperature fuse 33 provided for each door part 30.

Thus, even if the fire breaks out in an optional part inside the electronic device 15, it is possible to partially close the exhaust opening 25 with the proper door part 30 by providing plural door parts 30 for dividing the exhaust opening 25 and partially closing the exhaust opening 25 by each door part 30. Hence, it is possible to prevent the fire being spreading outside the electronic device 15. On the other hand, it is possible to exhaust the high temperature heat, smoke, and flammable gas outside the electronic device 15 via the open part of the exhaust opening 25. Accordingly, it is possible to avoid the inside of the electronic device 15 being filled with the high temperature heat, smoke, and flammable gas and avoid the fire leaking from a gap formed in the front surface of the electronic device 15.

As discussed above, according to the electronic device 15 of the first embodiment of the present invention, the exhaust opening is open in a normal state where fire does not break out inside the electronic device 15. Only when the fire breaks out inside the electronic device 15, the exhaust opening 25 is closed so that the spreading of the fire outside the electronic device 15 can be prevented. In addition, since the exhaust opening 25 is closed only when the fire breaks out inside the electronic device 15, it is possible to improve the cooling capabilities of the electronic device 15.

In particular, in the electronic device 15 of the first embodiment of the present invention, plural door parts 30 are provided at the exhaust opening 25 and the exhaust opening 25 is dividedly closed by the door parts 30.

In a case where the fire breaks out in the optional part inside the electronic device 15, the temperature fuse 33 provided at the door part 30 positioned in a part right above the part where the fire breaks out operates so that the door part 30 is closed. As a result of this, the spreading of the fire outside the electronic device 15 can be avoided. In addition, since the door parts 30 neighboring the door part 30 which closes in the exhaust opening 25 can be closed in order, it is possible to securely prevent the fire from spreading outside the electronic device 15.

On the other hand, as long as the temperature does not reach the operations temperature of the temperature fuse 33, the door part 30 does not close the exhaust opening 25 and the exhaust opening 25 remains open. Accordingly, it is possible to exhaust the high temperature heat, smoke, and flammable gas outside the electronic device 15 via the opening part of the exhaust opening 25, so that further burning can be prevented. Accordingly, it is possible to improve the self-extinguishing function of the electronic device 15.

It is general practice to use a fire-resistive material having a high oxygen concentration (oxygen index) necessary for continuing burning the material, as a component provided inside an electronic device such as the electronic device 15 of the first embodiment of the present invention. As the temperature of the air is decreased, this oxygen concentration (oxygen index) is increased. Accordingly, in the cooling structure of the electronic device 15 of the first embodiment of the present invention, the temperature inside the electronic device 15 is decreased by discharging the heated air with high cooling capabilities, so that the self-extinguishing function of the electronic device 15 can be improved.

In the meantime, the stopper 32 as a door rotation stopping member is provided at the lower part of the exhaust opening 25 so that the rotation of the door part 30 is stopped in a position oriented essentially perpendicular to a horizontal surface. In the example shown in FIG. 3, the stopper 32 has a configuration seen from the rear surface side of the electronic device 15 where a predetermined length in vertical directions (Z1-Z2 directions) is formed in two positions in the vicinity of the side surface (Y1 and Y2 side surfaces in FIG. 3) of the electronic device 15 and an extending and bent part in a width direction (Y1-Y 2 direction) is formed.

Figure 15:
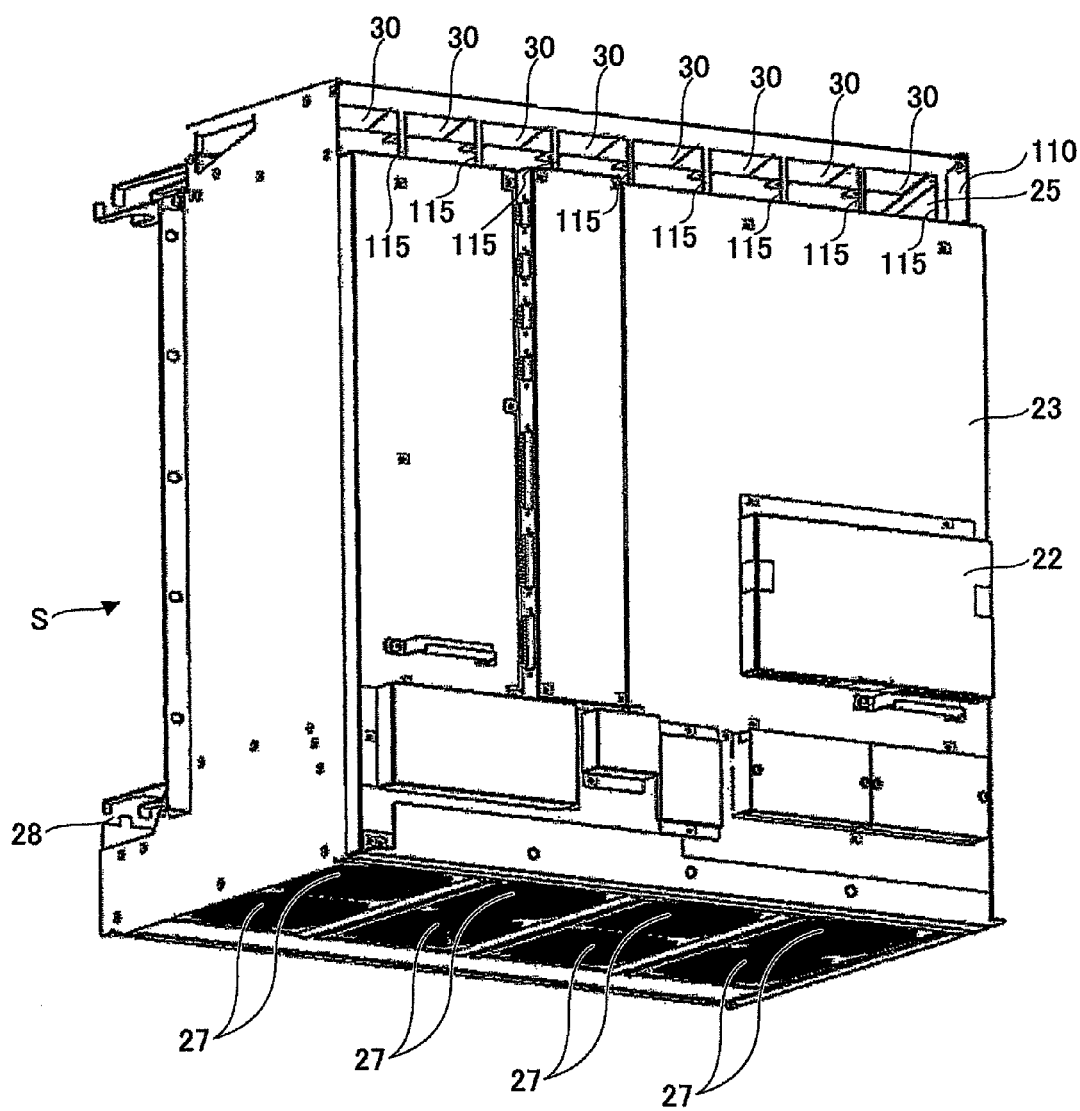
FIG. 15 is a first rear perspective view seen from a bottom side of an electronic device of a modified example of the electronic device shown in FIG. 3.

However, the present invention is not limited to this example. There is no limitation in a configuration and arrangement of the stopper. The stopper may have, for example, configurations shown in FIG. 15 and FIG. 16. FIG. 15 and FIG. 16 are first and second rear perspective views seen from a bottom side of an electronic device 100 of a modified example of the electronic device 15 shown in FIG. 3. In FIG. 15 and FIG. 16, parts that are the same as the parts shown in FIG. 3 are given the same reference numerals, and explanation thereof is omitted.

A state where none of the door parts 30 close in the exhaust opening 25, namely a normal state where fire has not broken out inside the electronic device 15, is shown in the example shown in FIG. 15.

In the example shown in FIG. 15, a door rotation stopping plate 110, as a door rotation stopping member configured to stop the rotation of the door part 30 by contacting the door part 30, is provided at the entire surface of the exhaust opening 25. Opening parts 115 having designated size are formed in the door rotation stopping plate 110. The number (eight in the example shown in FIG. 15) of the opening parts 115 are the same as the number of the door parts 30.

FIG. 16(a) shows where all door parts 30 come in contact with the door rotation stopping plate 110 so that the exhaust opening 25 is closed. FIG. 16(b) is an expanded view of a part surrounded by a dotted line in FIG. 16(a). In FIG. 16(a) and FIG. 16(b), one dotted line indicates an external configuration of the door parts 30 which come in contact with the door rotation stopping plate 110.

Eight opening parts 115 are formed in the door rotation stopping plate 110. Neighboring opening parts 115 are provided with a gap of length A. On the other hand, in order to rotate each door part 30, it is necessary to provide a slight gap (gap having a length B) between the neighboring door parts 30.

The length A between the neighboring opening parts 115 is greater than the length B of the gap between the neighboring door parts 30. Furthermore, in this example, if the exhaust opening 25 is closed by the neighboring door parts 30, a vertical direction part of the external circumference of the door part 30 is positioned between the neighboring opening parts 115 of the door rotation stopping plate 110.

Accordingly, if the exhaust opening 25 is closed by the neighboring door parts 30, a gap between the neighboring door parts 30 is positioned in a part where the opening part 115 is not formed of the door rotation stopping plate 110, so that the gap between the neighboring door parts 30 can be blocked by the part where the opening part 115 is not formed of the door rotation stopping plate 110. Accordingly, it is possible to avoid the fire leaking from the gap between the neighboring door parts 30 at the time of fire so that the spreading of the fire outside the electronic device 100 can be securely prevented.

In addition, in the above-discussed example, plural (three in the example shown in FIG. 2) electronic devices 15 are stacked in plural (three) steps in the cabinet 16. The top plate 26 is obliquely provided against the horizontal surface in each electronic device 15. The exhaust opening 25 of each electronic device 15 is open at the upper part of the rear surface (a surface of the X2 side in FIG. 3) of the electronic device 15.

However, the present invention is not limited to this example. There is no need to stack plural electronic devices in the cabinet and there is no limitation in the arrangement direction of the top plate. Furthermore, it is not always necessary to form the exhaust opening of the electronic device in the rear surface of the electronic device. The exhaust opening may be formed in a front surface of the electronic device.

In addition, in the above-discussed example, the electronic device 15 has the shelf S where plural PIUs are inserted in a state where the main surface of the printed wiring board is positioned in a direction perpendicular to the horizontal surface.

However, the present invention is not limited to this example. For example, the present invention can be applied an example where plural PIUs are inserted in a case where the main surface of the printed wiring board is positioned in a direction parallel with the horizontal surface, and air is taken in from the front surface and air is exhausted from the rear surface.

2. Second Embodiment of the Present Invention

Next, a second embodiment of the present invention is discussed. Closing structure and mechanisms of door parts at an exhaust opening of an electronic device of the second embodiment of the present invention are different from those of the electronic device 15 of the first embodiment of the present invention. Other parts of the electronic device of the second embodiment are the same as those of the electronic device 15 of the first embodiment of the present invention.

Accordingly, in the following explanation, the closing structure of the door parts at the exhaust opening of the electronic device of the second embodiment of the present invention is mainly discussed and then operation of the electronic device is discussed. In FIG. 17 through FIG. 32, parts that are the same as the parts shown in FIG. 3 through FIG. 16 are given the same reference numerals, and explanation thereof is omitted.

[Structure of the Electronic Device]

Figure 17:
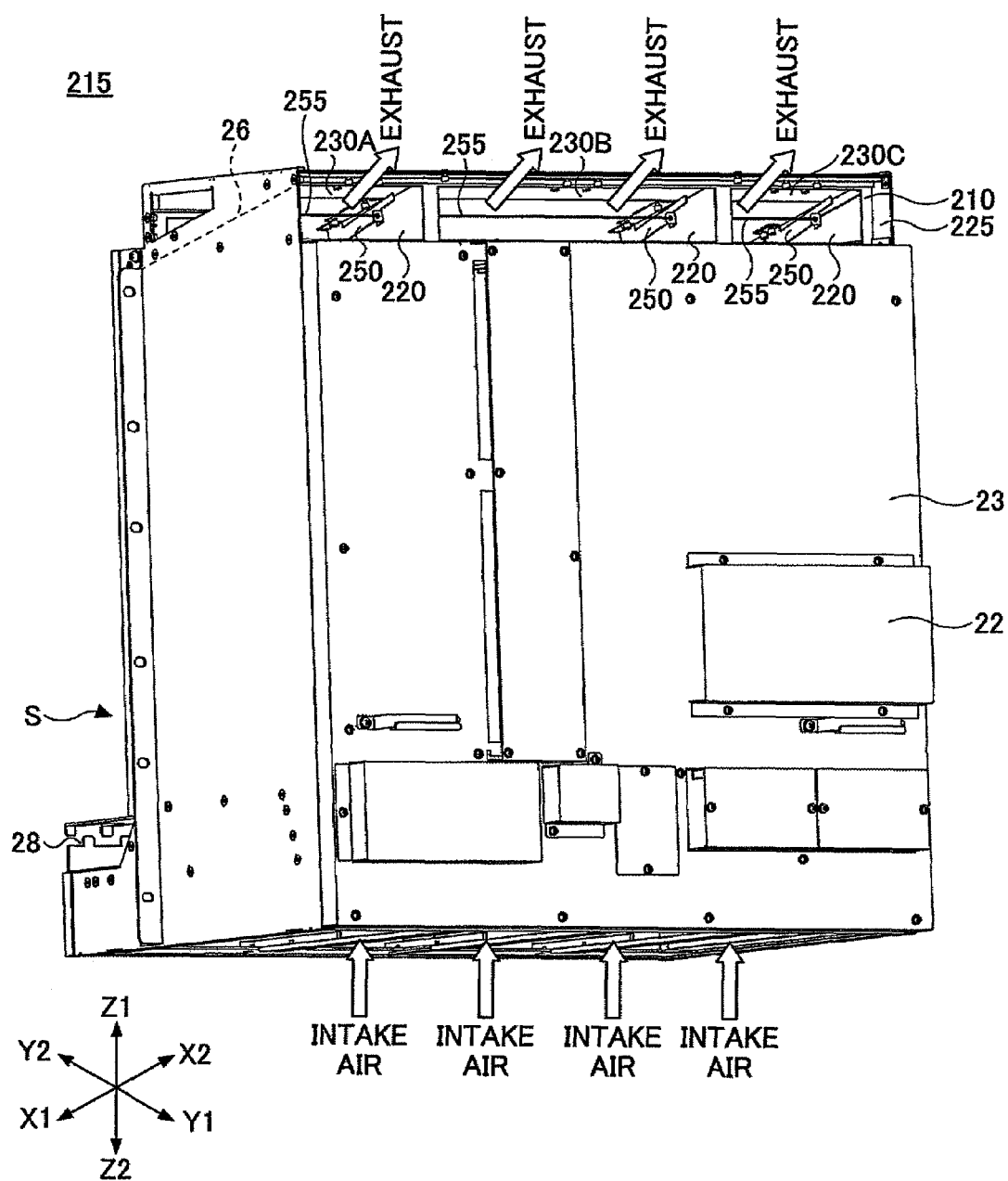
FIG. 17 is a rear perspective view seen from a bottom side of an electronic device of a second embodiment of the present invention.

FIG. 17 is a rear perspective view seen from a bottom side of the electronic device of the second embodiment of the present invention.

Referring to FIG. 17, in the shelf S provided at a front surface (a surface at an X1 side of FIG. 17) of the electronic device 215, plural PIUs where electronic components such as ICs (Integrated Circuit) or LSIs (Large Scale Integrated circuit) are mounted on a printed wiring board are inserted in an X2 direction in FIG. 17, in a state where the main surface of the printed wiring board is positioned in a direction essentially perpendicular to the ground.

In this example as well as the example shown in FIG. 2, metal partition plates (not shown in FIG. 17) are provided in the shelf S so that slots in the shelf S are divided. Because of this structure, even if the electronic components of the PIU or the printed wiring boards are burned due to the fire or the like, it is possible to prevent the fire from moving to the neighboring PIUs.

While these metal partition plates are provided at heights where top ends of the printed wiring boards of the PIUs are positioned, the metal partition plates are not provided in a position where an exhaust opening 225 open in an upper part of a rear surface (a surface at an X2 side of FIG. 3) of the electronic device 215 is situated, and thereby the exhaust opening 225 is not divided by the partition plates.

Door parts 230 discussed below are rotated so that the exhaust opening 225 provided at the upper part of the rear surface (the X2 side surface in FIG. 17) of the electronic device 215 is closed. In the example shown in FIG. 17, three door parts 230 (230A through 230C) are provided.

The top plate 26 is, as shown by a dotted line in FIG. 17, obliquely provided against a horizontal surface (X-Y surface) at the upper end of the electronic device 215. Thus, the rear surface side (the X2 side of FIG. 17) of the upper end of the electronic device 215 is situated higher than the front surface side (the X1 side of FIG. 17). The exhaust opening 225 is open in the upper part of the rear surface side (the X2 side of FIG. 17).

Since the temperature inside the electronic device 215 increases due to heat generated by the electronic components or the like, plural fans (not shown in FIG. 17) are provided at a lower part of the electronic device 215 as forced air cooling parts so that the inside of the electronic device 215 can be kept at a desirable temperature. In other words, an air intake opening is formed at a bottom part of the electronic device 215.

By using the fans, air is forcibly taken in from outside the electronic device 215 in a Z1 direction of FIG. 17 and made to circulate from a lower part to an upper part inside the electronic device 215, so that the heated electronic components are cooled. The moving direction of the warmed air is curved by an inside surface of the top plate 26 obliquely provided at the upper end of the electronic device 215 and the air is exhausted outside the electronic device 215 via the exhaust opening 225 provided at the upper part of the rear surface (the surface at an X2 side of FIG. 17) of the electronic device 215. The operations of the fans are not stopped even if fire breaks out in the slot of the shelf S.

An electronic apparatus is formed by stacking plural electronic devices 215 as well as the electronic devices 15 of the first embodiment of the present invention (see FIG. 2).

Here, closing structures of the door parts 230 at the exhaust opening 225 of the electronic device 215 are discussed with reference to FIG. 18 through FIG. 27.

Figure 18:
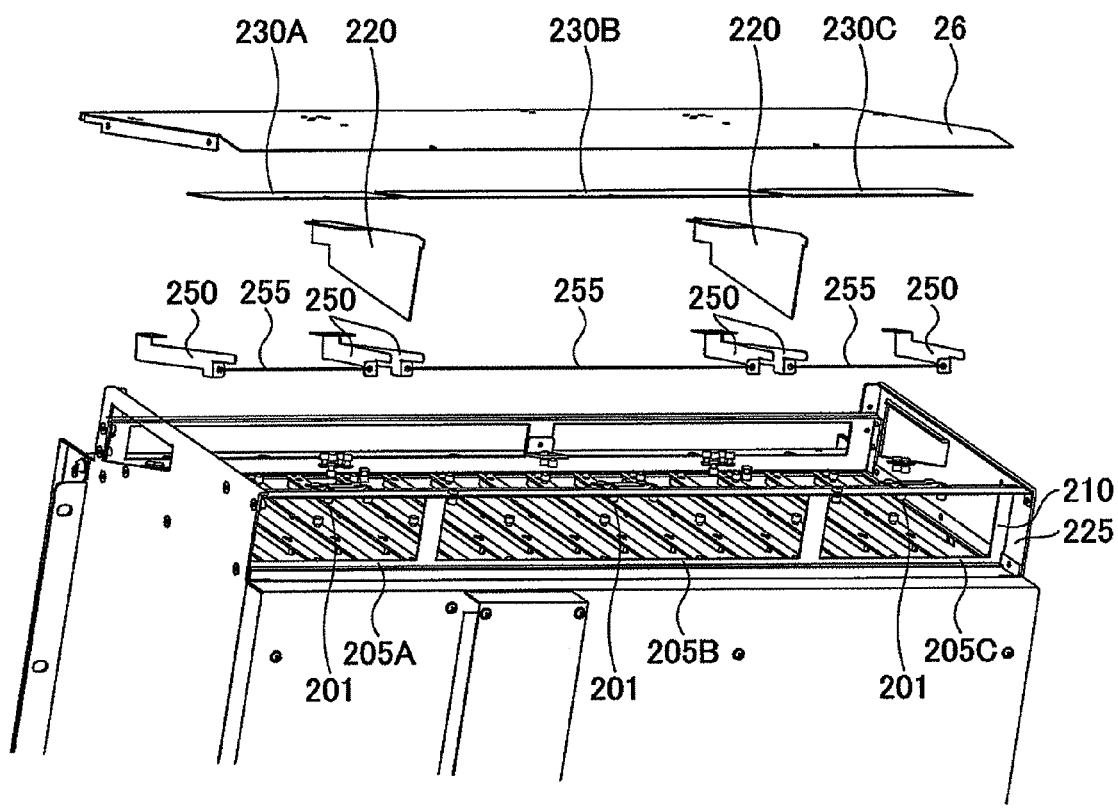
FIG. 18 is an exploded perspective view for explaining a structure of an exhaust opening of the electronic device shown in FIG. 17.

FIG. 18 is an exploded perspective view for explaining a structure of the exhaust opening 225 of the electronic device 215 shown in FIG. 17.

As shown in FIG. 18, the top plate 26, door parts 230A through 230C, a door rotation stopping plate 210, two partition plates 220, plate springs 250, ropes 255, and others are provided at the upper part of the electronic device 215.

The top plate 26 is obliquely provided at the upper end of the electronic device 215. The door parts 230A through 230C are rotatably provided against the top plate 26 via hinges 201. As corresponding to the door parts 230A through 230C, three opening parts 205A through 205C are formed in the door rotation stopping plate 210 provided at the entire surface of the exhaust opening 225. The partition plates 220 are provided between the door part 230B and the door part 230A and between the door part 230B and the door part 230C. Parts of the door parts 230A through 230C are provided at the top plate 26. The plate springs 250 are provided at the partition plates 220 and in the vicinities of the inside surfaces of the upper part of the electronic device 215. Parts of the plate springs 250 are provided at the top plate 26. The ropes 255 are stretched between pairs of the plate springs in the opening parts 205A through 205C.

Figure 19:
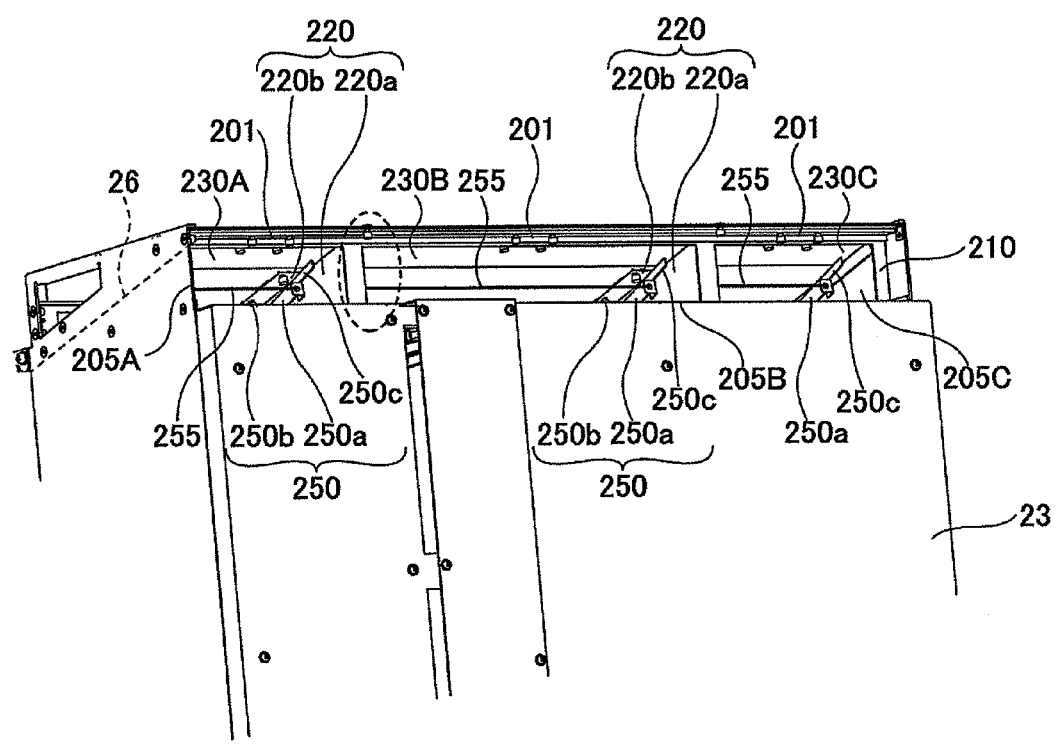
FIG. 19 is a perspective view seen from a bottom side of the exhaust opening of the electronic device shown in FIG. 17.

Here, the door parts 230A through 230C are discussed with reference to FIG. 19. FIG. 19 is a perspective view seen from a bottom side of the exhaust opening 225 of the electronic device 215 shown in FIG. 17.

As shown in FIG. 19, three door parts 230A through 230C are provided at the exhaust opening 225 of the electronic device 215. The area of the door part 230B positioned in the substantially center part of the exhaust opening 225 is greater than those of the door parts 230A and 230C situated left and right.

In a case where the electronic device 215 is in a normal state, the door parts 230A through 230C are positioned in the vicinities of the top plate 26 and come in contact with the plate springs 250 so as to be supported by the plate springs. In this state, side edge parts of the door parts 230A through 230C are positioned right above the partition plates 24 configured to divide the slots in the shelf S.

The door parts 230A through 230C are connected to the top plate 26 via the hinges 201. When the door parts 230A through 230C are rotated against the top plate 26 due to the own weight of the door parts 230A through 230C, the exhaust opening 225 is closed. If fire breaks out inside the electronic device 215, at least one of the door parts 230A through 230C is closed and at least one of the door parts 230A through 230C is not closed. Accordingly, at least a part of the exhaust opening 225 is open.

When the door parts 230A through 230C are rotated by the own weights so as to come in contact with the door rotation stopping plate 210, the rotation of the door parts 230A through 230C is stopped. The exhaust opening 225 is maintained closed by the door parts 230A through 230C due to the wind pressure of the air forcibly taken in from outside in the Z1 direction in FIG. 17 and flowing from a lower part to an upper part inside the electronic device 215 by the above-mentioned fans.

In this example, as discussed above, three opening parts 205A through 205C are formed in the door rotation stopping plate 210.

Figure 20:
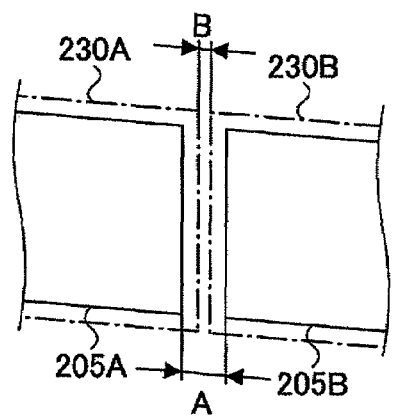
FIG. 20 is an expanded view of a part surrounded by a dotted line in FIG. 19.

FIG. 20 is an expanded view of a part surrounded by a dotted line in FIG. 19. There is a gap having length A between the neighboring opening parts 205A and 205B. On the other hand, there is a slight gap (gap having length B in this example) between the neighboring door parts 230A and 230B so that each of the door parts 230A and 230B can be rotated.

In this example, the length A of the gap between the neighboring opening parts 205A and 205B is greater than the length B of the gap between the neighboring door parts 230A and 230B. In addition, in this example, if the exhaust opening is closed by the neighboring door parts 230A and 230B, vertical parts of the external circumference of the door parts 230A and 230B are positioned in the gap between neighboring opening parts 205A and 205B. This measurement relationship is also applied to the neighboring opening parts 205B and 205C.

If the exhaust opening 225 is closed by the neighboring door parts 230, the gap between the neighboring door parts 230 is positioned in a part of the door rotation stopping plate 210 where the opening parts 205 are not formed. Therefore, it is possible to block the gap between the neighboring door parts 230 by the part of the door rotation stopping plate 210 where the opening parts 205 are not formed. Accordingly, it is possible to avoid the fire leaking from the gap between the neighboring parts 230 at the time of the fire, so that the spreading of the fire outside the electronic device 215 can be securely prevented.

Referring back to FIG. 19, the partition plates 220 are provided between the door part 230B and the door part 230A and between the door part 230B and the door part 230C. The exhaust opening 225 can be divided into three areas, namely an area where the door part 230A is provided, an area where the door part 230B is provided, and an area where the door part 230C is provided.

Figure 21:
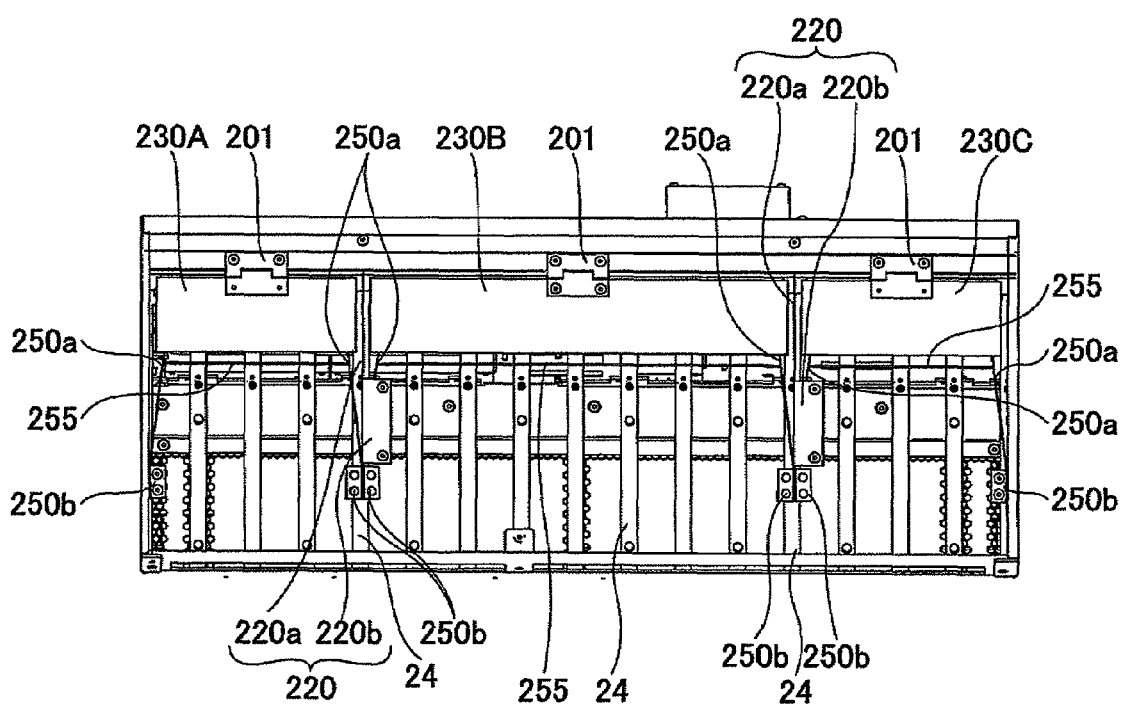
FIG. 21 is a plan view of the electronic device shown in FIG. 17 in a state where a top plate is removed.

FIG. 21 is a plan view of the electronic device shown in FIG. 17 in a state where the top plate 26 (see FIG. 17) is removed. An upper part of FIG. 21 shows the rear surface side of the electronic device 215.

As shown in FIG. 19 and FIG. 21, the door partition plate 220 includes a main body part 220a, a fixing part 220b, and others. The main body part 220a has a main surface in a vertical direction. The fixing part 220b is extended from the main body part 220a and formed by bending at a designated angle. The fixing part 220b is fixed to the top plate 26 by a fixing member such as a screw.

Figure 22:
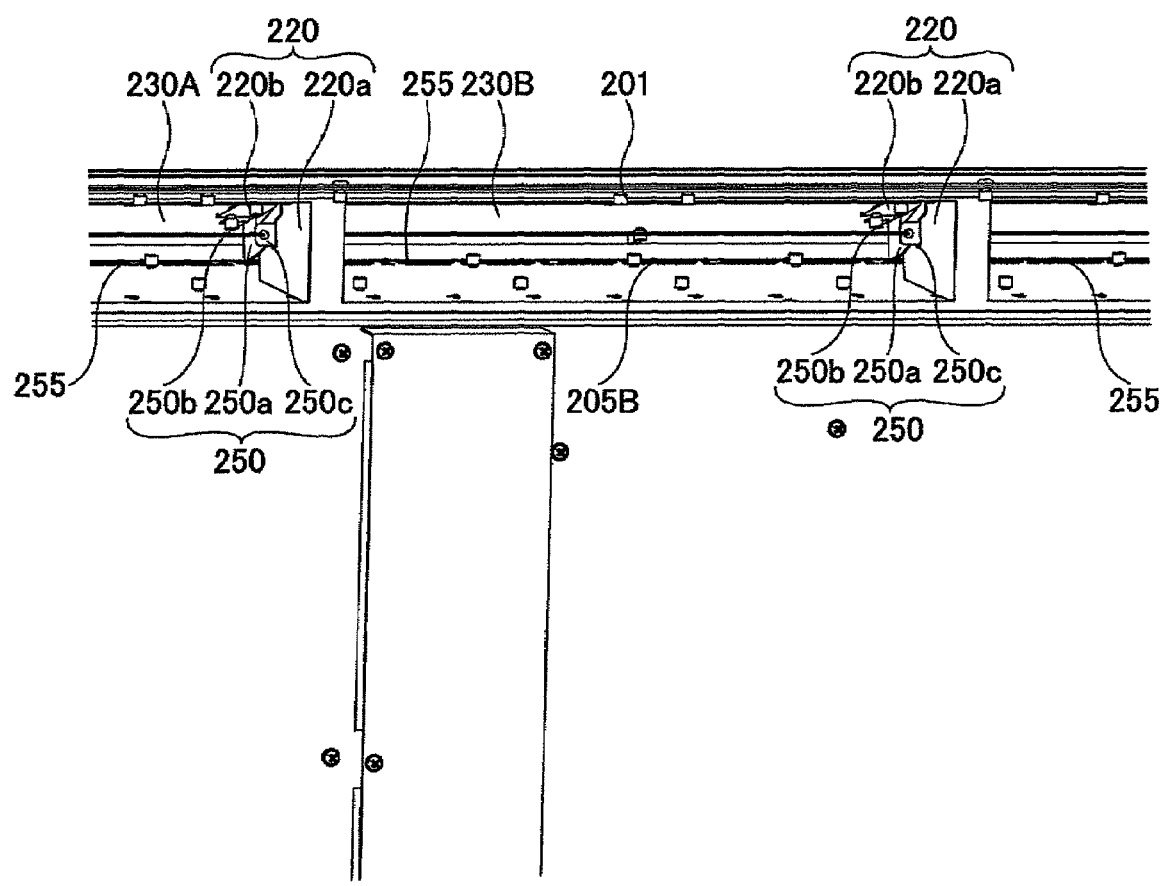
FIG. 22 is an expanded view of an area where a door part 230B is provided in the exhaust opening shown in FIG. 19.

FIG. 22 is an expanded view of an area where the door part 230B is provided in the exhaust opening 225 shown in FIG. 19.

As shown in FIG. 21 and FIG. 22, while the exhaust opening 225 is divided by the door partition plate 220 at the rear surface side of the electronic device 215, the front surface side, unlike the rear surface side, of the electronic device 215 is not divided. In other words, an area where the door partition plate 220 is not provided is formed in the front surface side of the electronic device 215.

Accordingly, when the fire breaks out in the electronic device 215, the fire goes to the front surface side of the electronic device 215 where the door partition plate 220 is not provided.

As shown in FIG. 21, the main body part 220a of the door partition plate 220 is positioned right above the partition plate 24 configured to divide the slots. In addition, an end part of the main body part 220a at the front surface side of the electronic device 215 is positioned at the front surface side of the electronic device 215 closer than the ropes 255 stretched between the pairs of the plate springs 250 of the opening parts 205A through 205C. Actions of this structure are discussed below.

Next, structures of the plate springs provided at the partition plates 220 and in the vicinities of the inside surfaces of the upper part of the electronic device 215 and the ropes 255 that are stretched between pairs of the plate springs in the opening parts 205A through 205C are discussed. Here, parts of the plate springs 250 are provided at the top plate 26.

Figure 23:
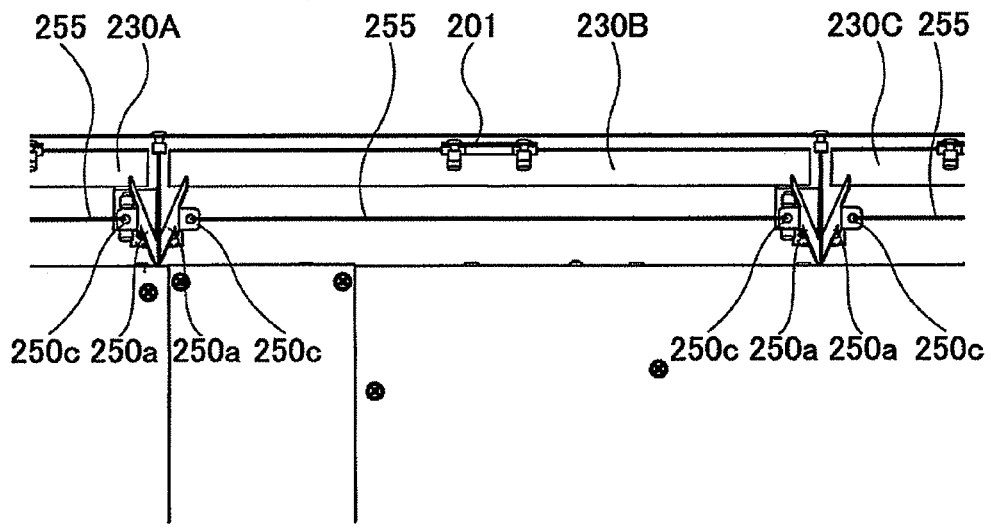
FIG. 23 is a perspective view seen from a bottom side of the area shown in FIG. 22 where the door part 230B is provided.

FIG. 23 is a perspective view seen from a bottom side of the area shown in FIG. 22 where the door part 230B is provided. While the area where the door part 230B is provided is mainly illustrated in FIG. 23, the same structure is formed in the areas where the door part 230A and 230C are provided.

As shown in FIG. 21 and FIG. 23, the plate spring 250 as an elastic member includes a main body part 250a, a top plate fixing part 250b, a rope fixing part 250C , and others. The main body part 250a has a main surface in a vertical direction. The top plate fixing part 250b is extended from the main body part 250a at the rear surface side of the electronic device 215 and bent at approximately 90 degrees inside the door part 230A through 230C.

Lengths between the pairs of the plate springs provided in the opening parts 205A through 205c are greater than the widths of the door parts 230A through 230C. The main body part 250a of the plate spring 250 substantially comes in contact with the main body part 220a of the door partition plate 220 before the ropes 255 are provided.

The top plate fixing part 250b is fixed to the top plate 26 by a fixing member such as a screw. The top plate fixing part 250b may not be provided but an end part of the main body part 250a of the plate spring 250 at a front surface side of the electronic device 215 may be fixed to the main body part 220a of the door partition plate 220.

Both end parts of the ropes 255 are provided to the corresponding rope fixing parts 250c of the plate springs 250 so that the ropes 255 are stretched in the width directions of the door parts 230A through 230C.

The rope 255 is a thread or line shaped thin and long member, such as a wire, which can be melted at a designated temperature. The rope 255 is shorter than a gap between the rope fixing parts 250c of the plate springs 250. When both end parts of the rope are fixed to the corresponding fixing parts 250c, the main body part 250a and the rope fixing part 250c of the plate spring 250 are pulled by the rope 255 so as to be bent (elastically deformed) inside the door parts 230A through 230C.

A gap of head end parts of each of the main body parts 250a at the rear surface side of the electronic device 215 of the elastically deformed plate springs 250 is shorter than the width of the gap between door parts 230A through 230C. Accordingly, the head end parts of the main body parts 250a of the plate springs 250 at the rear surface side of the electronic device 215 are positioned right under the corresponding door parts 230A through 230C which can be rotated against the top plate 26 via the hinge 201 due to the own weight. Accordingly, the door parts 230A through 230C are supported by the head end parts of the main body parts 250a of the plate springs 250 so that the opening state of the door parts 230A through 230C can be held.

In other words, in a case where the electronic device 215 is in a normal state, the door parts 230A through 230C are positioned between the top plate 26 and the head end parts of the main body parts 250a of the plate springs 250 at the rear surface side of the electronic device 215.

In a case where the electronic device 215 is in a normal state, the air inside the electronic device 215 is warmed by heat generated by the electronic components provided in the electronic device 215 so that the temperature of the air in the exhaust opening 225 of the electronic device 215 is increased to approximately 80° C. In addition, since the rope 255 is always stretched by a restoring force of the plate spring 250 both of whose ends are fixed, a creep wherein the rope 255 changes with time may be generated.

Because of this, the elastic force of the plate springs 250 and the length and material of the rope 255 are selected so that the plate springs 250 being shifted outside the door parts 230A and 230C due to the extension of the ropes 255 by heat or creep can be avoided so that the support of the door parts 230A and 230C by the plate spring 250 is not broken and thereby the door parts 230A and 230C are not closed.

In addition, the material of the rope 255 is selected by considering that the rope 255 should not melt and break at a temperature such as 80° C. of the air in the exhaust opening 225 in a normal state of the electronic device 215 and should be melted at a temperature of the air in the exhaust opening 225 higher than the above-mentioned temperature.

Figure 24:
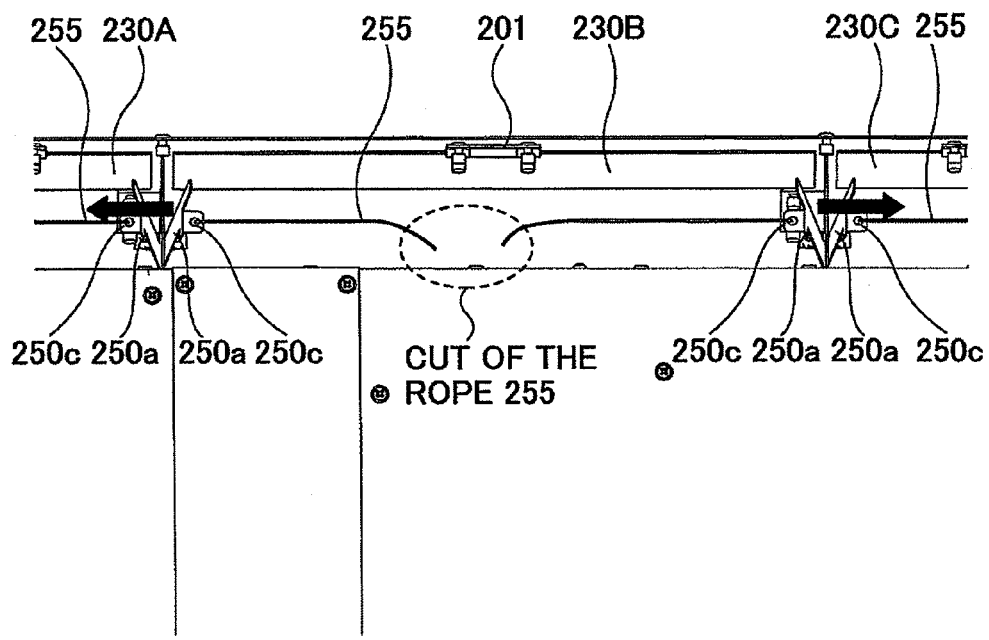
FIG. 24 is a first view for explaining rotational operations of the door part in a case where fire breaks out inside the electronic device shown in FIG. 17.
Figure 25:
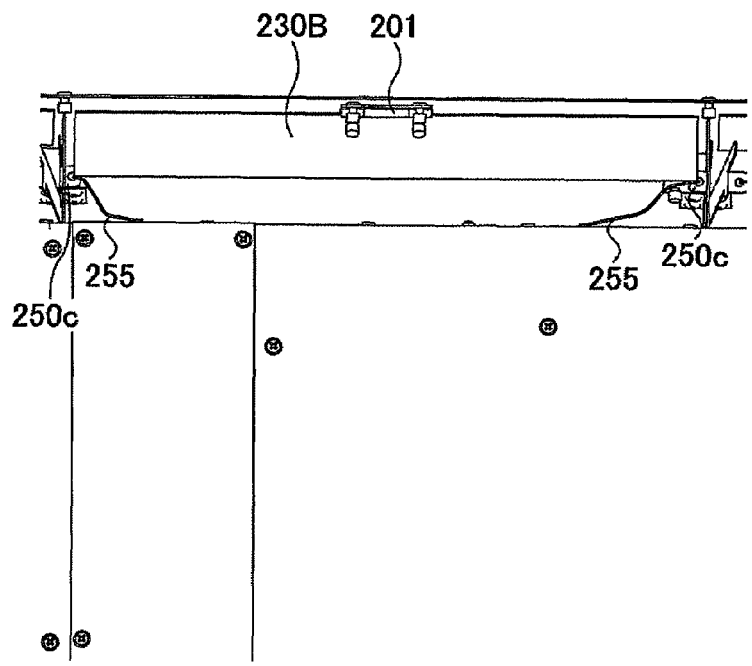
FIG. 25 is a second view for explaining rotational operations of the door part in a case where fire breaks out inside the electronic device shown in FIG. 17.
Figure 26:
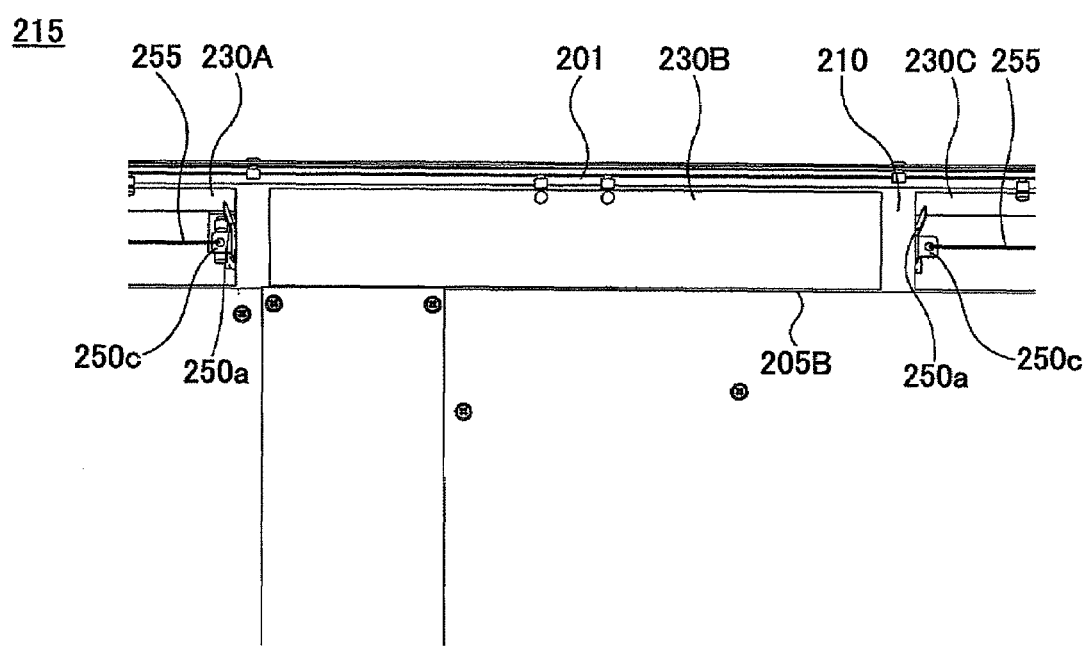
FIG. 26 is a third view for explaining rotational operations of the door part in a case where fire breaks out inside the electronic device shown in FIG. 17.

On the other hand, when the fire breaks out inside the electronic device 215, the door parts 230A through 230C are rotated as shown in FIG. 24 through FIG. 26. Here, FIG. 24 through FIG. 26 are first through third views for explaining rotational operation of the door part 230A through 230C in a case where fire breaks out inside the electronic device 215 shown in FIG. 17. While only the rotational operation of the door part 230B is shown in FIG. 24 through FIG. 26 for the convenience of explanation, the same rotational operations can be applied to the door part 230A and 230C.

Based on the rope 255 being cut by burning or melting of the rope 255 due to the fire or extended by heat, the plate spring 250 is restored. As a result of this, the plate spring 250 is shifted outside the door part 230B as indicated by an arrow in FIG. 24 so that the support of the door part 230B by the plate spring 250 is broken, and thereby, as shown in FIG. 25, the door part 230B is rotated via the hinge 201 by the own weight of the door part 230B.

When the door part 230B comes in contact with the door rotation stopping part 210, the rotation of the door part 230B is stopped as shown in FIG. 26.

The exhaust opening 225 by the door part 230B is maintained closed by the wind pressure of the air forcibly taken in from outside in the Z1 direction in FIG. 17 and flowing from a lower part to an upper part inside the electronic device 215 by the above-mentioned fans.

In the following explanations, the operations of the electronic device 215 having the closing structure of the door part 230 in the exhaust opening are discussed.

[Operations of the Electronic Device]

As discussed above, when the electronic device 215 is in a normal state, the head end parts of the main body part 250a of the plate springs 250 at the rear surface side of the electronic device 215 are positioned right under the corresponding door parts 230A through 230C configured to be rotated against the top plate 26 via three hinges 201 by the own weight (see FIG. 21 and FIG. 23). Accordingly, the door parts 230A through 230C are supported by the head end parts so that an open state of the door parts 230A through 230C is maintained.

When the fire breaks out inside the electronic device 215, depending on a part where the fire is generated, the door parts 230A through 230C are operated as follows.

1. When the Fire Breaks Out in the Vicinity of the Center of the Electronic Device 215

Figure 27:
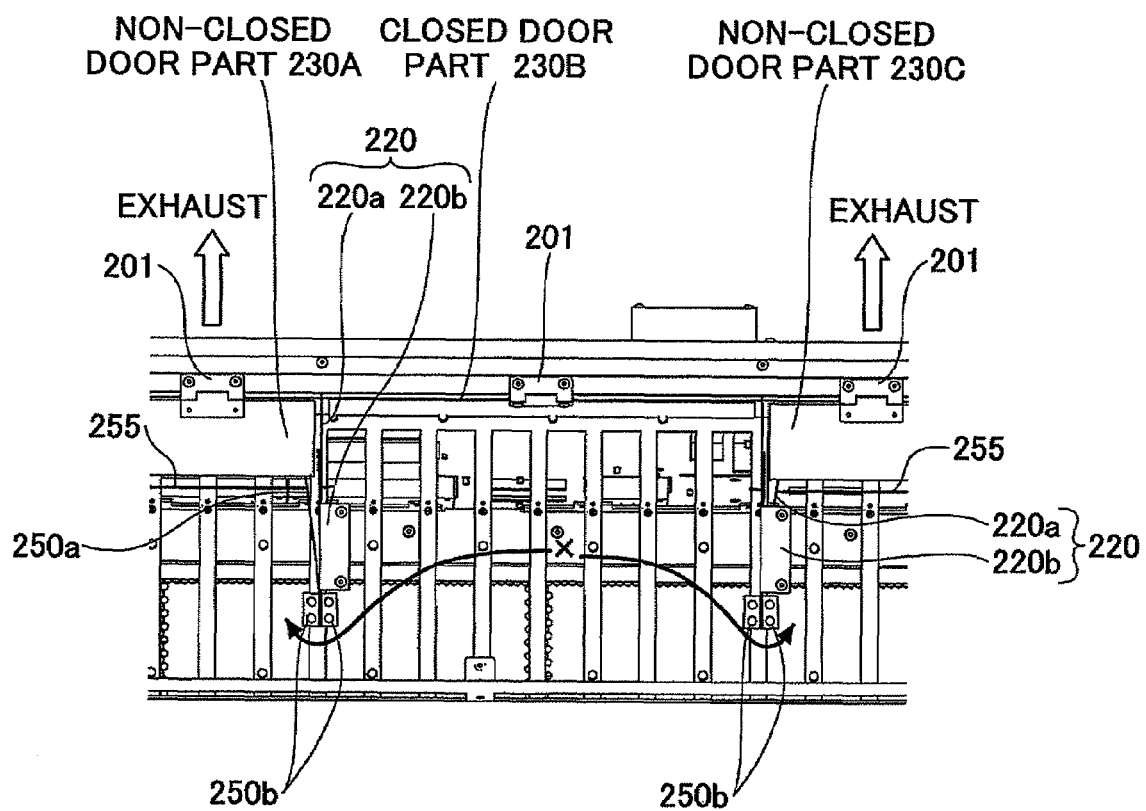
FIG. 27 is a view for explaining rotational operations of the door part in a case where fire breaks out in the vicinity of the center of the electronic device shown in FIG. 17.

FIG. 27 is a view for explaining rotational operations of the door parts 230A through 230C in a case where the fire breaks out in the vicinity of the center of the electronic device shown 215 in FIG. 17.

When the fire breaks out at the lower part of the door part 230B and in the vicinity of the center part of the inside of the electronic device 215 (the part where the fire breaks out is indicated by a mark x in FIG. 27) so that the fire reaches the height at which the rope 255 is positioned, the rope 255 stretched in an area where the door part 230B is positioned is burned or melted due to the fire so that the plate spring 250 is restored. As a result of this, the door part 230B is rotated via the hinge 201 by the own weight of the door part 230B and thereby the area where the door part 230B is positioned is closed in the exhaust opening 225.

On the other hand, as discussed with reference to FIG. 21 and FIG. 22, while the exhaust opening 225 at the rear surface side of the electronic device 215 is divided by the door partition plate 220, the front surface side of the electronic device 215 is not divided in the same way as the rear surface side. In other words, an area where the door partition plates 220 are not provided is formed at the front surface side of the electronic device 215 (see FIG. 21 and FIG. 22).

Therefore, the air forcibly taken in from the outside in the Z1 direction in FIG. 17 by the fans and flowing from the lower part to the upper part inside the electronic device 215 goes around the door partition plate 220 and is discharged from left and right areas of the area where the door part 230B is provided. The fire, following the flow of the air, goes to the front surface side of the electronic device 215 (lower side of FIG. 27) where the door partition plate 220 is not provided as shown by the black arrow in FIG. 27.

However, as shown in FIG. 19, the area of the door part 230B positioned in the substantially center part of the exhaust opening 225 is greater than the areas of the door parts 230A and 230C positioned to the left and right of the door part 230B.

Accordingly, the fire does not reach the ropes stretched in the areas where the door parts 230A and 230C positioned in left and right of the door part 230B are positioned so that the ropes 255 are not cut. Accordingly, the areas in the exhaust opening 225 where the door parts 230A and 230C are positioned are not closed.

Thus, when the fire breaks out in the vicinity of the center of the electronic device 225, since the door part 230B positioned in the substantially center part of the exhaust opening 225 is closed, it is possible to prevent the fire being spreading outside of the electronic device 215.

In addition, while the fire goes to the front surface side of the electronic device 215, the door parts 230A and 230C are not closed. Therefore, a part of the exhaust opening 225 is maintained open. It is possible to exhaust the high temperature heat, smoke, and flammable gas outside the electronic device 215 via the open part of the exhaust opening 225, so that further burning can be prevented.

Accordingly, it is possible to improve a self-extinguishing function of the electronic device 215.

2. When the Fire Breaks Out in the Vicinity of the Door Partition Plate 220

Figure 28:
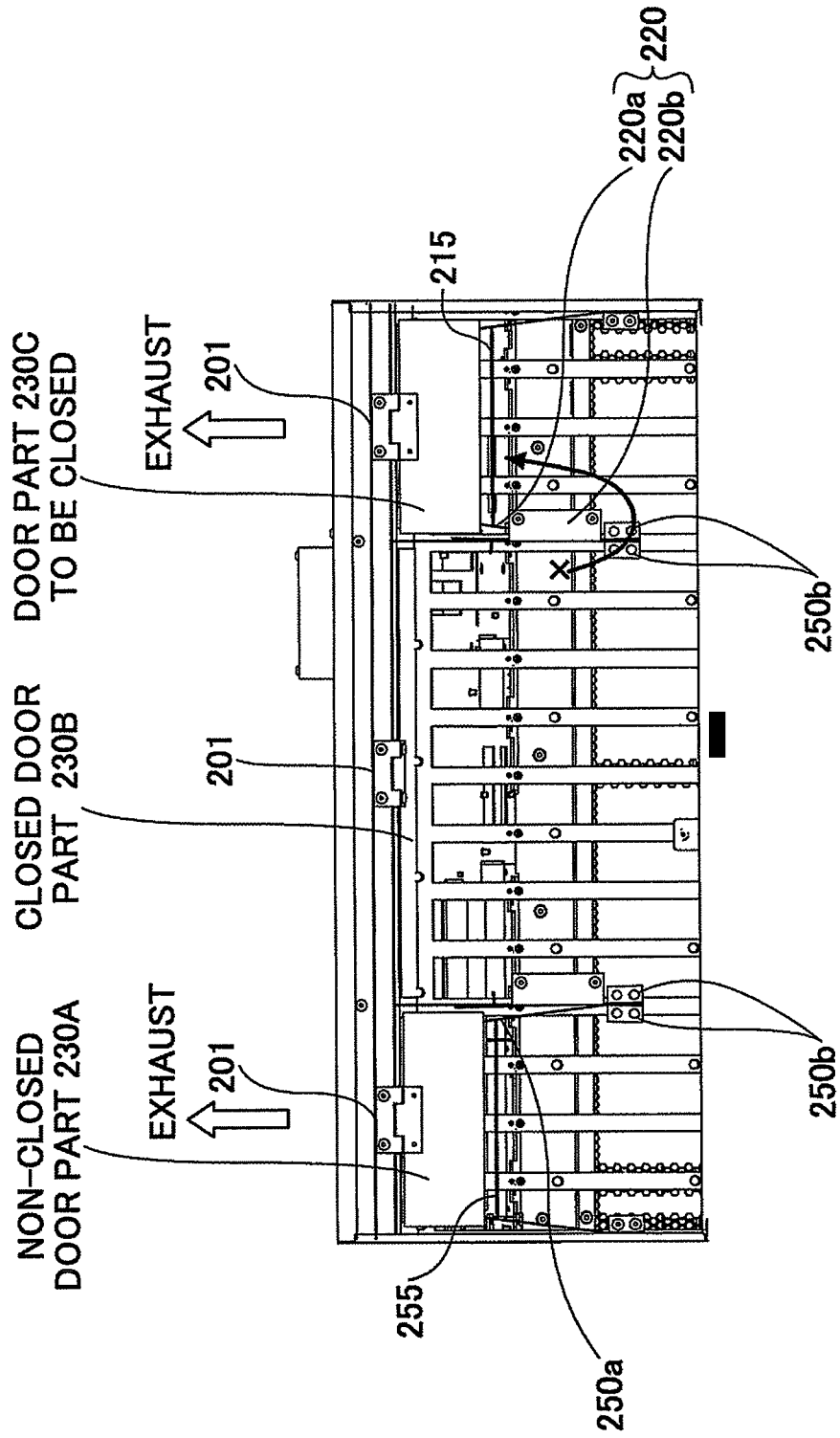
FIG. 28 is a first view for explaining rotational operations of the door part in a case where fire breaks out in the vicinity of a partition plate situated between the door parts.
Figure 29:
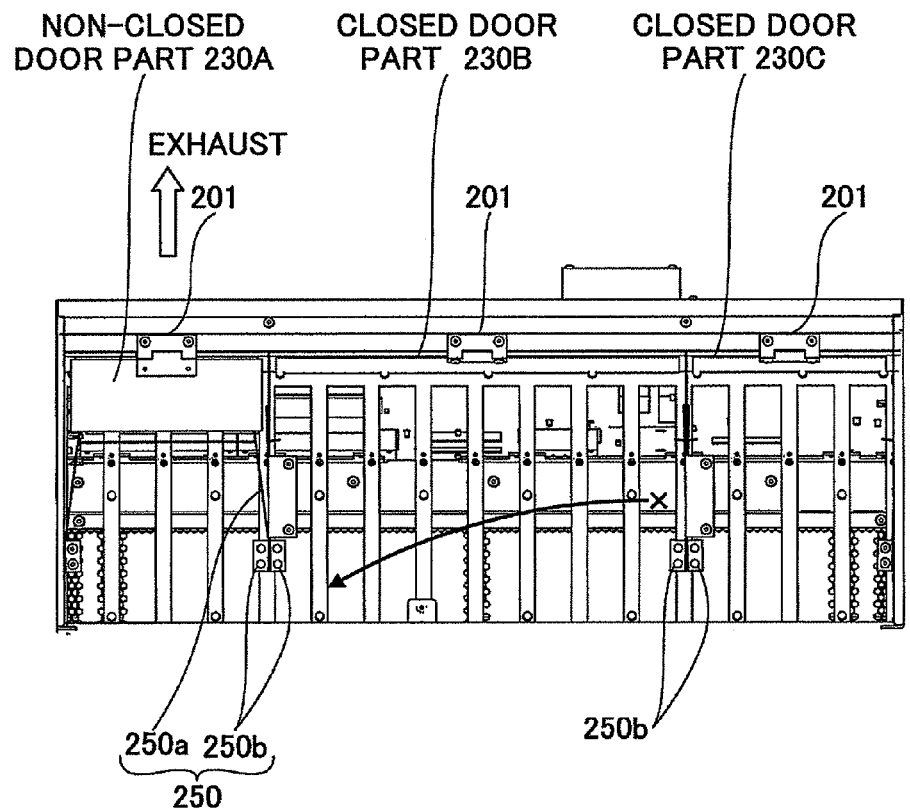
FIG. 29 is a second view for explaining rotational operations of the door part in a case where fire breaks out in the vicinity of a partition plate situated between the door parts.

FIG. 28 and FIG. 29 are first and second views for explaining rotational operations of the door part in a case where the fire breaks out in the vicinity of the door partition plate 220 situated between the door parts 230B and 230C.

When the fire breaks out at the lower part of the door part 230B and in the vicinity of the door partition plate 220 positioned between the door parts 230B and 230C of the inside of the electronic device 215 (the part where the fire breaks out is indicated by a mark x in FIG. 28 and FIG. 29) so that the fire reaches the height at which the ropes 255 are positioned, the rope 255 stretched in an area where the door part 230B is positioned is burned or melted due to the fire so that the plate spring 250 is restored. As a result of this, the door part 230B is rotated via the hinge 201 by the own weight of the door part 230B and thereby the area where the door part 230B is positioned in the exhaust opening 225 is closed.

The air forcibly taken in from the outside in the Z1 direction in FIG. 17 by the fans and flowing from the lower part to the upper part inside the electronic device 215 goes around the door partition plate 220 and is discharged from left and right areas of the area where the door part 230B is provided. The fire, following the flow of the air, goes to the front surface side of the electronic device 215 (lower side of FIG. 27) where the door partition plate 220 is not provided as shown by the black arrow in FIG. 28.

Accordingly, as shown by the black arrow in FIG. 28, the fire goes to the neighboring area where the door part 230C is provided via the door partition plate 220 positioned via the part where the fire breaks out so that the fire reaches the height at which the rope 255 is positioned. The rope 255 is burned or melted due to the fire so that the plate spring is restored. As a result of this, the door part 230C is rotated via the hinge 201 by the own weight of the door part 230C and thereby the area where the door part 230C is positioned is closed in the exhaust opening 225 (see FIG. 28).

As a result of this, only the door part 230A situated farthest from the part where the fire breaks out is not closed so that the air exhaust is made via the door part 230A. Although the fire goes to the door part 230A side, the fire does not reach the rope 255 stretched in the area where the door part 230A is positioned and therefore the rope 255 is not cut. Accordingly, the area in the exhaust opening 225 where the door part 230A is positioned is not closed (see FIG. 29).

Thus, when the fire breaks out in the vicinity of the door partition plate 220, since the door part 230B positioned in the substantially center part of the exhaust opening 225 and the door part 230C positioned in the vicinity of the part where the fire breaks out are closed, it is possible to prevent the fire being spreading outside of the electronic device 215.

In addition, while the fire goes to the front surface side of the electronic device 215, the door part 230A situated farthest from the part where the fire breaks out is not closed. Therefore, a part of the exhaust opening 225 is maintained open. It is possible to exhaust the high temperature heat, smoke, and flammable gas outside the electronic device 215 via the opening part of the exhaust opening 225, so that further burning can be prevented. Accordingly, it is possible to improve a self-extinguishing function of the electronic device 215.

3. When the Fire Breaks Out in the Area where the Door Part 230A (230C) is Provided When the fire breaks out at the lower part of the door part 230A or 230C provided in the left and right of the door part 230B of the inside of the electronic device 215 so that the fire reaches the height at which the rope 255 is positioned, the rope 255 stretched in an area where the door part 230A or 230C is positioned is burned or melted due to the fire so that the plate spring 250 is restored. As a result of this, the door part 230A or 230C is rotated via the hinge 201 by the own weight of the door part 230A or 230C and thereby the area where the door part 230A or 230C is positioned is closed in the exhaust opening 225.

The air forcibly taken in from the outside in the Z1 direction in FIG. 17 by the fans and flowing from the lower part to the upper part inside the electronic device 215 goes around the door partition plate 220 and is discharged from the area where the door part 230B is provided. The fire following the flow of the air goes to the front surface side of the electronic device 215 (lower side of FIG. 27) where the door partition plate 220 is not provided as shown by the black arrow in FIG. 27.

In a case where the part where the fire breaks out is separated from the door partition plate 220 provided between the door part 230A (230C) and the door part 230B so that the fire does not reach the rope 255 stretched in the area where the door part 230B is provided, the rope 255 is not cut. Accordingly, the area in the exhaust opening 225 where the door part 230B is positioned is not closed. In this case, only the door part 230A (230C) is open.

In a case where the part where the fire breaks out is close to the door partition plate 220 provided between the door part 230A (230C) and the door part 230B so that the fire reaches the rope 255 stretched in the area where the door part 230B is provided, the rope 255 is cut by fire burning and melting. Accordingly, the plate spring 250 is restored and the door part 230B is rotated via the hinge by the own weight of the door part 230B and therefore the area in the exhaust opening 225 where the door part 230B is positioned is closed.

As a result of this, only the door part 230A or 230C situated farthest from the part where the fire breaks out is not closed so that the air is exhausted via the door part 230A. Although the fire goes to the door part 230A or 230C side, the fire does not reach the ropes 255 stretched in the area where the door part 230A or 230C is positioned and therefore the rope 255 is not cut. Accordingly, the area in the exhaust opening 225 where the door part 230A or 230C is positioned is not closed.

Thus, when the fire breaks out in the area where the door part 230A (230C) is situated that is left or right side of the door part 230B, since at least the door part 230A (230C) is closed, it is possible to prevent the fire being spreading outside of the electronic device 215.

In addition, while the fire goes to the front surface side of the electronic device 215, the door part 230C (230A) situated farthest from the part where the fire breaks out is not closed. Therefore, a part of the exhaust opening 225 is maintained open. It is possible to exhaust the high temperature heat, smoke, and flammable gas outside the electronic device 215 via the opening part of the exhaust opening 225, so that further burning can be prevented. Accordingly, it is possible to improve a self-extinguishing function of the electronic device 215.

Thus, according to the second embodiment of the present invention, the rope 255 is stretched longer than the width of the door part 230A through 230C in the area where the door part 230A through 230C is provided. Therefore, in a case where the fire breaks out in any slots in the area where the door part 230A through 230C is provided, or regardless of the temperature distribution in the area (e.g., only a specific part has high temperature), the rope 255 is cut by fire burning, melting, or extension, so that the plate spring 250 is restored. As a result of this, the door part 230A through 230C are rotated via the hinge 201 by the own weight of the door part 230A through 230C and therefore the area in the exhaust opening 225 where the door parts 230A through 230C are positioned is closed. Hence, it is possible to prevent the fire from being spreading outside the electronic device 215.

An area where the door partition plate 220 is formed at the front surface side of the electronic device 215. The air forcibly taken in from the outside by the fans and flowing from the lower part to the upper part inside the electronic device 215 goes around the door partition plate 220. The fire following the flow of the air goes to the front surface side of the electronic device 215 where the door partition plate 220 is not provided.

Accordingly, it is possible to avoid after one of the door parts 230A through 230C is closed, the fire going around the vicinity of this door part 230A through 230C and being spread out from the rear surface side of the electronic device 215 where neighboring other door parts 230A through 230C are provided, to the outside.

In addition, since the fire goes around the front surface side of the electronic device 215 where the area not having the door partition plate 220 is formed, the time length of the fire in the electronic device 215 becomes large. Accordingly, since the fire can be cut in the electronic device 215, it is possible to prevent the fire from being spreading outside the electronic device 215.

In addition, even if the fire is not cut in the electronic device 215, when the fire reaches the rope 255 situated in front of the exhaust opening 25 and in the area where other door parts 230A through 230C are provided, the rope 255 is cut by the fire burning, melting or is extended so that the plate spring 250 is restored. As a result of this, other door parts 230A through 230C are rotated via the hinge 201 by the own weight and thereby the area in the exhaust opening 225 is closed where the other door parts 230A through 230C are closed. Hence, it is possible to prevent the fire from being spreading outside the electronic device 215.

Even if the fire breaks out in any part inside the electronic device 215, at least one of the door parts 230A through 230C is not closed so that at least a part of the exhaust opening 225 is always open. Accordingly, it is possible to exhaust the high temperature heat, smoke, and flammable gas outside the electronic device 215 via the opening part of the exhaust opening 225, so that further burning can be prevented. Accordingly, it is possible to improve a self-extinguishing function of the electronic device 215.

In other words, according to the second embodiment of the present invention, it is possible to form closing parts and opening parts in the exhaust opening 225 by three door parts 230A through 230C when the fire breaks out in the electronic device 215. By partially closing the exhaust opening 225, it is possible to prevent the fire being spreading outside the electronic device 215 and exhaust the high temperature heat, smoke, and flammable gas outside the electronic device 215 via the opening part of the exhaust opening 225, so that further burning can be prevented. Accordingly, it is possible to improve a self-extinguishing function of the electronic device 215.

Figure 30:
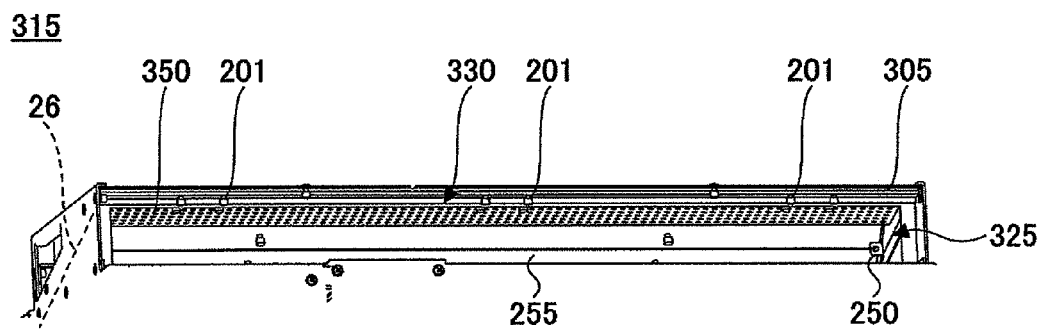
FIG. 30 is a first perspective view of the exhaust opening of an electronic device of a first modified example of the electronic device shown in FIG. 17.
Figure 31:
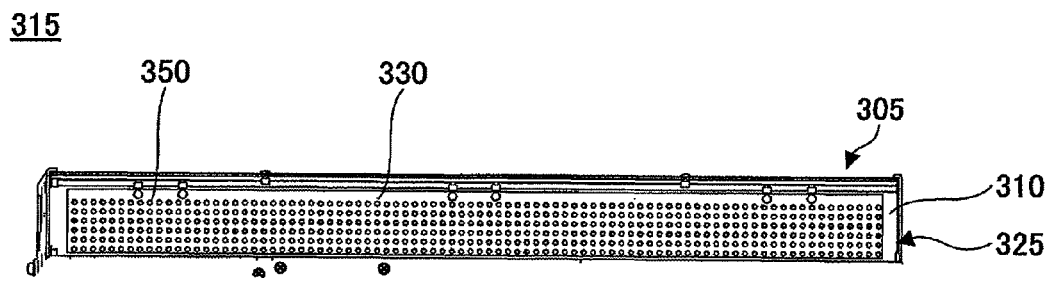
FIG. 31 is a second perspective view of the exhaust opening of an electronic device of a first modified example of the electronic device shown in FIG. 17.

In the meantime, while three door parts 230A through 230C are provided in the exhaust opening 225 in the example shown in FIG. 17 through FIG. 28, the present invention is not limited to this example. The present invention can be applied to an example, as shown in FIG. 30 and FIG. 31, where a single door part is provided in the exhaust opening. Here, FIG. 30 and FIG. 31 are first and second perspective views of the exhaust opening of an electronic device of a first modified example of the electronic device 215 shown in FIG. 17.

As shown in FIG. 30, in this modified example, a single door part 330 having the length slightly shorter than the entire width of the exhaust opening 325 is provided. The door part 330 as well as the above-discussed door parts 230A through 230C, is provided rotatably against the top plate 26 via the hinges 201.

A door rotation stopping plate 310 (see FIG. 31) having an opening part 305 slightly larger than the door part 330 is provided in an exhaust opening 325. In this example as well as the example shown in FIG. 17 through FIG. 29, when the door part 330 is rotated by the own weight and comes in contact with the door rotation stopping plate 310, the rotation of the door part 330 is stopped. In addition, the exhaust opening 325 by the door part 330 is maintained open by the wind pressure of the air forcibly taken in from outside and flowing from a lower part to an upper part inside the electronic device 315 by the above-mentioned fans.

A pair of the plate springs 250 whose parts are provided on the top plate 26 are provided in the vicinity of the inside surfaces of the upper part of the electronic device 315. The rope 255 is stretched between the pair of the plate springs 250. The plate springs 250 have the same arrangement gap, and a fixing structure and a configuration of the top plate 26 of the plate springs 250 shown in FIG. 17 through FIG. 29. In addition, the rope 255 is fixed to the plate springs 250 in the same way as the rope 255 shown in FIG. 17 through FIG. 29.

In this modified example, a large number of small openings 350 having diameters of approximately 1 mm through 3 mm are formed in the door part 330 with gaps of approximately 10 through 30 mm.

In a case where the electronic device 315 is in a normal state, the door part 330 is positioned between the top plate 26 and the head end part of the main body part 250a of the plate springs 250 at the rear surface side of the electronic device 215.

On the other hand, when fire breaks out inside the electronic device 215, based on a part of the rope 255 near the part where the fire breaks out being cut by burning or melting of the rope 255 due to the fire or extended by heat, the plate springs 250 are restored. As a result of this, the plate springs 250 are shifted outside the door part 330 so that the support of the door part 330 by the plate springs 250 is broken, and thereby the door part 330 is rotated via the hinges 201 by the own weight of the door part 330.

When the door part 330 comes in contact with the door rotation plate 210 as shown in FIG. 31, the rotation of the door part 330 is stopped. In addition, the exhaust opening 325 is maintained closed by the door part 330 due to the wind pressure of the air forcibly taken in from outside and flowing from a lower part to an upper part inside the electronic device 315 by the above-mentioned fans.

As discussed above, the rope 255 is stretched along the entire width of the exhaust opening 325 and a single door part 330 is provided in this modified example. Accordingly, even if the fire breaks out in any part of the electronic device 315, the part of the rope 255 near the part where the fire breaks out is cut, so that the entire exhaust opening 325 is closed by the single door part 330. Accordingly, it is possible to prevent the fire being spreading outside the electronic device 315.

Furthermore, in this modified example, a large number of the openings 350 are formed in the door part 330. Therefore, it is possible to exhaust the high temperature heat, smoke, and flammable gas outside the electronic device 315 via the openings 350, so that further burning can be prevented. Accordingly, it is possible to improve a self-extinguishing function of the electronic device 215.

In other words, in the modified example, a large number of the openings 350 formed in the door part 330 function as a door part not closing but partially leaving open the exhaust opening 325 among three door parts 230A through 230C in the example shown in FIG. 17 through FIG. 29 when the fire breaks out in the electronic device 215.

Although the fire becomes spreading along the closed door part 330 so that a part of the fire comes outside the electronic device 315 via the openings 350 formed in the door part 330, the length of the fire from the openings 350 is short because each opening is a small hole. Accordingly, it is possible to prevent the fire from being spreading outside the electronic device 315.

In addition, the number of the door parts is one and a pair of the plate springs 250 is provided in this modified example. Therefore, it is possible to reduce the number of parts and the manufacturing cost.

In the example shown in FIG. 17 through FIG. 29, an end part of the rope 255 is fixed to the plate spring whose part is fixed to the top plate 26, namely a rope fixing part 250c, and the rope 255 is stretched in a width direction of the door parts 230A through 230C. However, the present invention is not limited to this example and may be applied in an example shown in FIG. 32. Here, FIG. 32 is a perspective view of the exhaust opening of an electronic device 415 of a second modified example of the electronic device 215 shown in FIG. 17.

Figure 32:
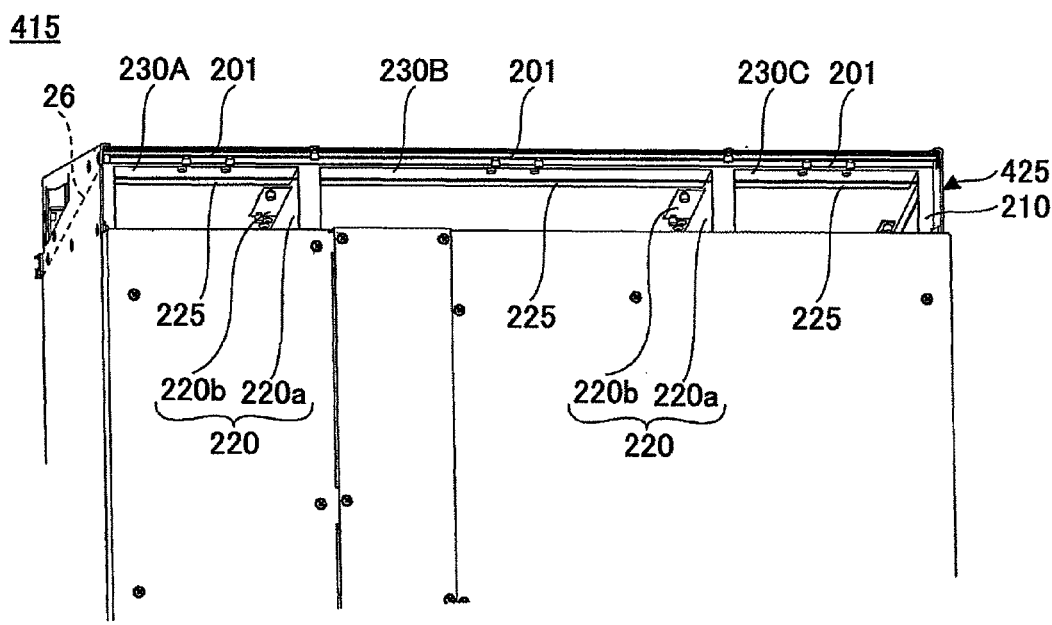
FIG. 32 is a perspective view of the exhaust opening of an electronic device of a second modified example of the electronic device shown in FIG. 17.

Referring to FIG. 32, in this example, the plate spring (not shown in FIG. 19) is not provided. The rope 255 is fixed to the door partition plates 220 provided between the door parts 230B and 230A and between the door parts 230B and 230C and an upper part of the inside surface of the upper part of the electronic device 215. The rope 255 is stretched between the door partition plates 220 and the inside surface of the upper part of the electronic device 415.

In a case where the electronic device 415 is in a normal state, the door parts 230A through 230C are directly supported from lower parts by the rope 255 so that the door parts 230A through 230C are not rotated by the own weights of the door parts 230A through 230C.

On the other hand, when the fire breaks out inside the electronic device 415, the rope 255 is cut by the fire burning or melting so that the support to the door parts 230A through 230C by the rope 255 is broken. As a result of this, the door parts 230A through 230C are rotated via the hinges 201 by the own weights of the door parts 230A through 230C. When the door parts 230A through 230C come in contact with the door rotation stopping plate 210, the rotation of the door parts 230A through 230C is stopped. In addition, the exhaust opening 425 is maintained closed by the door parts 230A through 230C due to the wind pressure of the air forcibly taken in from outside and flowing from a lower part to an upper part inside the electronic device 415 by the above-mentioned fans.

In this example as well as the example shown in FIG. 17 through FIG. 29, it is possible to form closing parts and opening parts in the exhaust opening 425 by three door parts 230A through 230C when the fire breaks out in the electronic device 415. By partially closing the exhaust opening 425, it is possible to prevent the fire being spreading outside the electronic device 415 and exhaust the high temperature heat, smoke, and flammable gas outside the electronic device 415 via the opening part of the exhaust opening 425, so that further burning can be prevented. Accordingly, it is possible to improve a self-extinguishing function of the electronic device 415.

Although the invention has been described with respect to specific embodiment for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-12115 filed on Jan. 23, 2007 and Japanese Priority Patent Application No. 2007-165317 filed on Jun. 22, 2007, the entire contents of which are hereby incorporated by reference.

What is claimed is:

1. An electronic device having an exhaust opening configured to exhaust air outside, the electronic device comprising:

a door part configured to close the exhaust opening by rotating; and a line shaped member stretched along the substantially full width of the door part so as to keep the door part from rotating and keep the exhaust opening open;

wherein the lined shaped member is formed of meltable materials and has a substantially uniform cross-sectional shape;

wherein when the line shaped member is cut or extended in a length equal to or greater than a designated length, the door part is rotated by the own weight of the door part and closes the exhaust opening;

elastic members are provided at the exhaust opening and in the vicinities of both ends of the door part;

the elastic members have a natural position and are separated in their entirety by a distance greater than a full width of the door part, and the elastic members are elastically deformed by providing the line shaped member;

the door part is supported by the elastically deformed elastic members so that the door part is maintained opened; and when the line shaped member is cut or extended in a length equal to or greater than the designated length due to excessive heat in the electronic device causing the meltable materials of the line shape member to melt, the elastic members return to the natural position, support of the door part is broken and the door part is rotated by the own weight of the door part and closes the exhaust opening.

2. The electronic device as claimed in claim 1, wherein at least three of the door parts configured to close the exhaust opening by rotation are provided; and an area of one of the door parts positioned in a substantially center area of the exhaust opening is greater than an area of another of the door parts neighboring the one door part positioned in the substantially center area of the exhaust opening.

3. The electronic device as claimed in claim 2, wherein a partition plate is provided between neighboring of the door parts;

the exhaust opening is divided by the partition plate; and a part not divided by the partition plate is formed at a side of the electronic device opposite a side where the exhaust opening is provided.

4. The electronic device as claimed in claim 1, wherein the number of the door parts configured to close the exhaust opening by rotation is one; and an opening hole is formed in the door part.

5. A fire protecting mechanism of an electronic device having an exhaust opening configured to exhaust air outside, the fire protecting mechanism of the electronic device comprising:

a plurality of door parts configured to close the exhaust opening by rotating;

a plurality of pairs of elastic members provided at the exhaust opening, each elastic member of the pair of elastic members is provided in the vicinity of an opposing width of each door part, and the pair of elastic members having a natural position and are separated in their entirety by a distance greater than a full width of the each door part; and a plurality of line shaped members, each line shaped member having one of the elastic members on opposing ends, the line shaped member stretches and elastically deforms the each elastic member of the pair of elastic members to inside of the each door part;

wherein each line shaped member is formed of meltable materials and has a substantially uniform cross-sectional shape;

wherein the each door part is supported by a corresponding pair of elastically deformed elastic members so that a state where the respective door part is open to the exhaust opening is maintained;

wherein when one of the line shaped members is cut or extended in a length equal to or greater than a designated length due to excessive heat in the electronic device causing the meltable materials of the line shape member to melt, the corresponding pair of elastic members returns to the natural position, the each door part rotates by the own weight of the each door part and closes a first portion of the exhaust opening; and another of the plurality of the door parts maintains a second portion of the exhaust opening open.

6. The fire protecting mechanism as claimed in claim 5, wherein a partition plate is provided between the neighboring door parts, and the partition plate has an opening at a side far from the exhaust opening which is an intake opening of the electronic device being at a side away from the exhaust opening; and wherein when a fire breaks out and the at least one of the door parts is closed, the fire is led to a side far from the neighboring exhaust opening that remains open.

* * * * *